United States Patent
Choi

(10) Patent No.: US 7,221,182 B2
(45) Date of Patent: *May 22, 2007

(54) OPEN DRAIN TYPE OUTPUT BUFFER

(75) Inventor: Jung-Hwan Choi, Suwon-Si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 86 days.

This patent is subject to a terminal disclaimer.

(21) Appl. No.: 10/938,534

(22) Filed: Sep. 13, 2004

(65) Prior Publication Data
US 2005/0030060 A1   Feb. 10, 2005

Related U.S. Application Data

(63) Continuation-in-part of application No. 10/425,824, filed on Apr. 30, 2003, now Pat. No. 6,831,478.

(30) Foreign Application Priority Data
Feb. 18, 2003   (KR) ...................... 10-2003-0010053

(51) Int. Cl.
*H03K 17/16* (2006.01)
*H03K 19/003* (2006.01)

(52) U.S. Cl. .............................. 326/26; 326/27; 326/87

(58) Field of Classification Search ............ 326/26–27, 326/30, 87; 327/108–112
See application file for complete search history.

(56) References Cited

U.S. PATENT DOCUMENTS

| 6,073,245 A | 6/2000 | Hirata et al. |
|---|---|---|
| 6,710,617 B2 | 3/2004 | Humphrey |
| 2003/0212843 A1* | 11/2003 | Molgaard et al. ........... 710/100 |

OTHER PUBLICATIONS

Chinese Office Action dated Jun. 9, 2006, with English translation.

* cited by examiner

*Primary Examiner*—Anh Q. Tran
(74) *Attorney, Agent, or Firm*—Harness, Dickey and Pierce, PLC

(57) ABSTRACT

The open-drain type output buffer includes a first driver and at least one of (1) at least one secondary driver and (2) at least one tertiary driver. The first driver selectively pulls an output node towards a low voltage based on input data. The secondary and tertiary drivers have first and second states. Each secondary and tertiary driver pulls the output node towards the low voltage when in the first state, and does not pull the output node towards the low voltage in the second state. A control circuit, when a secondary driver is included, controls the secondary driver such that the secondary driver is in the first state when it has been determined that at least two consecutive high voltage output data have been generated. The control circuit, when a tertiary driver is included, controls the tertiary driver such that the tertiary driver is in the second state when it has been determined that at least two consecutive low voltage output data have been generated.

14 Claims, 12 Drawing Sheets

US 7,221,182 B2

OPEN DRAIN TYPE OUTPUT BUFFER

RELATED APPLICATION DATA

This is a Continuation-in-part application of U.S. Ser. No. 10/425,824 filed Apr. 30, 2003, now U.S. Pat. No. 6,831,478 the entire contents of which are hereby incorporated by reference.

BACKGROUND OF THE INVENTION

The present invention relates to open drain type output buffers. FIG. 1(a) illustrates a circuit diagram of an NMOS open-drain type output buffer system. The NMOS open drain type output buffer system 100 includes an NMOS open drain type output buffer 110 having an output pad 120. The output pad 120 is connected via a channel 130 to a power supply Vterm (often called a termination power Vterm) via a termination resistor Rterm. The channel 130 represents, for example, a bus or a portion of a bus, over which a device including the open drain type output buffer 110 and other devices (not shown) communicate.

The NMOS open-drain type output buffer 110 includes a N-type MOS (NMOS) transistor MN. The NMOS transistor MN has its drain coupled to the termination power Vterm via the output pad 120, the channel 130 and the termination resistor Rterm. The NMOS transistor MN has its source coupled to the ground power VSS, and the gate of the NMOS transistor MN is controlled by input data DIN.

When the logic value of the input data DIN is "1" and a high input data voltage represents the logic "1" state, a pull-down current I flows down from the termination power Vterm (e.g., 1.8V) to ground power VSS (e.g., 1.0V) via the NMOS transistor MN. As a result, an output data DOUT at the output pad 120 and the channel 130 is a low voltage VOL=Vterm−I*Rterm. When the logic value of the input data DIN is "0" and a low input data voltage represents the logic "0" state, the output data DOUT is a high voltage VOH=Vterm.

FIG. 1(b) shows the voltage level of the input data DIN in relation to the output data DOUT. In this type of open drain output buffer system 100, the low voltage VOL as output data DOUT typically represents a logic "1" and the high voltage VOH as output data DOUT typically represents logic "0".

There also exist PMOS output drain buffer systems where a P-type MOS (PMOS) transistor is connected between a high, power supply voltage VDD (e.g., 1.8V) and a low, termination voltage Vterm (e.g., 1.0V). More specifically, the PMOS transistor is connected to the termination voltage Vterm via an output pad, a channel, and a termination resistor Rterm. Here, a low input voltage DIN representing a logic "0" produces a low output voltage DOUT also representing a logic "0", and a high input voltage DIN representing a logic "1" produces a high output voltage DOUT representing a logic "1".

Unfortunately, open drain type output buffer systems such as discussed above are adversely affected by Intersymbol Interference (ISI). ISI is where previous symbols cause an unwanted variation in the voltage representing successive symbols. As such ISI can result in the erroneous detection of the output data DOUT. FIGS. 2(a), 2(b), 3(a) and 3(b) illustrate examples of the voltage variation in the output data DOUT caused by ISI for the open drain type output buffer system 100 in FIG. 1(a).

FIG. 2(a) shows a voltage variation Δ1 of the output data DOUT caused by ISI when input data DIN transitions from two successive logic "1"s to "0". As shown, the channel attenuation of the output data DOUT is represented by A, when the input data DIN toggles between logic value "0" and "1". As the input data DIN toggles between logic "0" and "1", the output data DOUT voltage transitions between a high voltage level VOH=Vterm−A and a low voltage level VOL=Vterm−I*Rterm+A. As further shown, the logic state of the output data DOUT is determined based on the voltage level of the output data DOUT in relation to a reference voltage Vref. When the output data DOUT exceeds the reference voltage Vref, the output data DOUT is recognized as a logic "0"; and when the output data DOUT is less than the reference voltage Vref, the output data DOUT is recognized as a logic "1".

When the input data DIN is two successive "1"s, the channel attenuation of the output data DOUT reduces to A−Δ1 due to the increased turn-on time of the NMOS transistor MN. This causes an increase in the transition time, which is the time for the output data DOUT to transition above or below the reference voltage Vref when changing from one logic value to another.

FIG. 2(b) illustrates a voltage variation Δ2 of the output data DOUT caused by ISI when the input data DIN transitions from three successive logic "1"s to "0". The channel attenuation A−Δ2 of the output data DOUT in this situation is even less than the case of transitioning from two successive "1"s to "0". The lengthening of the transition time T1 during toggling of the input data DIN to the transition time T2 in this instance demonstrates the amount of skew that occurs in the voltage of the output data DOUT as a result of the ISI.

FIG. 3(a) illustrates a voltage variation Δ1 of the output data DOUT cause by ISI when the input data DIN transitions from two successive logic "0"s to "1". As stated before, when the input data DIN toggles between logic value "0 and "1", the channel attenuation of the output data DOUT is A so that the high voltage level of the output data DOUT is VOH=Vterm−A and the low voltage level of the output data DOUT is VOL=Vterm−I*Rterm+A. When the input data DIN is two successive "0"s, the channel attenuation of the output data DOUT reduces to A−Δ1 due to the increased turn-off time of the NMOS transistor MN. Consequently, the transition time of the output data DOUT is skewed in a manner similar to that discussed above with respect to FIG. 2(a).

FIG. 3(b) illustrates a voltage variation Δ2 of the output data DOUT caused by ISI when the input data DIN transitions from three successive logic "0"s to "1". The channel attenuation A−Δ2 of the output data DOUT is even less than the case of the transition from two successive logic "0"s to "1" due to the increased turn-off time of the NMOS transistor MN. Consequently, the transition time of the output data DOUT is skewed in a manner similar to that discussed above with respect to FIG. 2(b).

SUMMARY OF THE INVENTION

In the present invention, the open drain type output buffer includes a control circuit that detects the potential for skew in transition time of the output data and controls a driver circuit to mitigate against the skew.

In one exemplary embodiment, the driving circuit includes a first driver and at least one secondary driver. The first driver selectively pulls an output node towards a low voltage based on input data. The secondary driver has first and second states. The secondary driver pulls the output node towards the low voltage when in the first state, but does not pull the output node towards the low voltage in the second state. The control circuit determines when at least two consecutive low voltage output data at an output node have been generated, and controls the secondary driver such that the secondary driver is in the second state when the control circuit determines at least two consecutive low voltage output data have been generated.

In another exemplary embodiment, the driving circuit includes a first driver and at least one secondary driver. The first driver selectively pulls an output node towards a low voltage based on input data. The secondary driver has first and second states. The secondary driver pulls the output node towards the low voltage when in the first state, but does not pull the output node towards the low voltage in the second state. The control circuit determines when a transition from a steady high voltage output data to a low voltage output data occurs at an output node and controls the secondary driver such that the secondary driver is in the first state when the transition is determined.

In a further exemplary embodiment, the driving circuit includes a first driver and at least one secondary driver. The first driver selectively pulls an output node towards a low voltage based on input data. The secondary driver has first and second states. The secondary driver pulls the output node towards the low voltage when in the first state, but does not pull the output node towards the low voltage in the second state. The control circuit determines when at least two consecutive high voltage output data at an output node have been generated, and controls the secondary driver such that the secondary driver is in the first state when the control circuit determines at least two consecutive high voltage output data have been generated.

Further embodiments of the invention combine one or more of the features of above-described embodiments, and/or apply the buffer of the present invention to a device such as a memory device.

BRIEF DESCRIPTION OF THE DRAWINGS

The present invention will become more fully understood from the detailed description given below and the accompanying drawings, wherein like elements are represented by like reference numerals, which are given by way of illustration only and thus are not a limit on the present invention and wherein.

DETAILED DESCRIPTION OF EMBODIMENTS

First Embodiment

Figure 4:
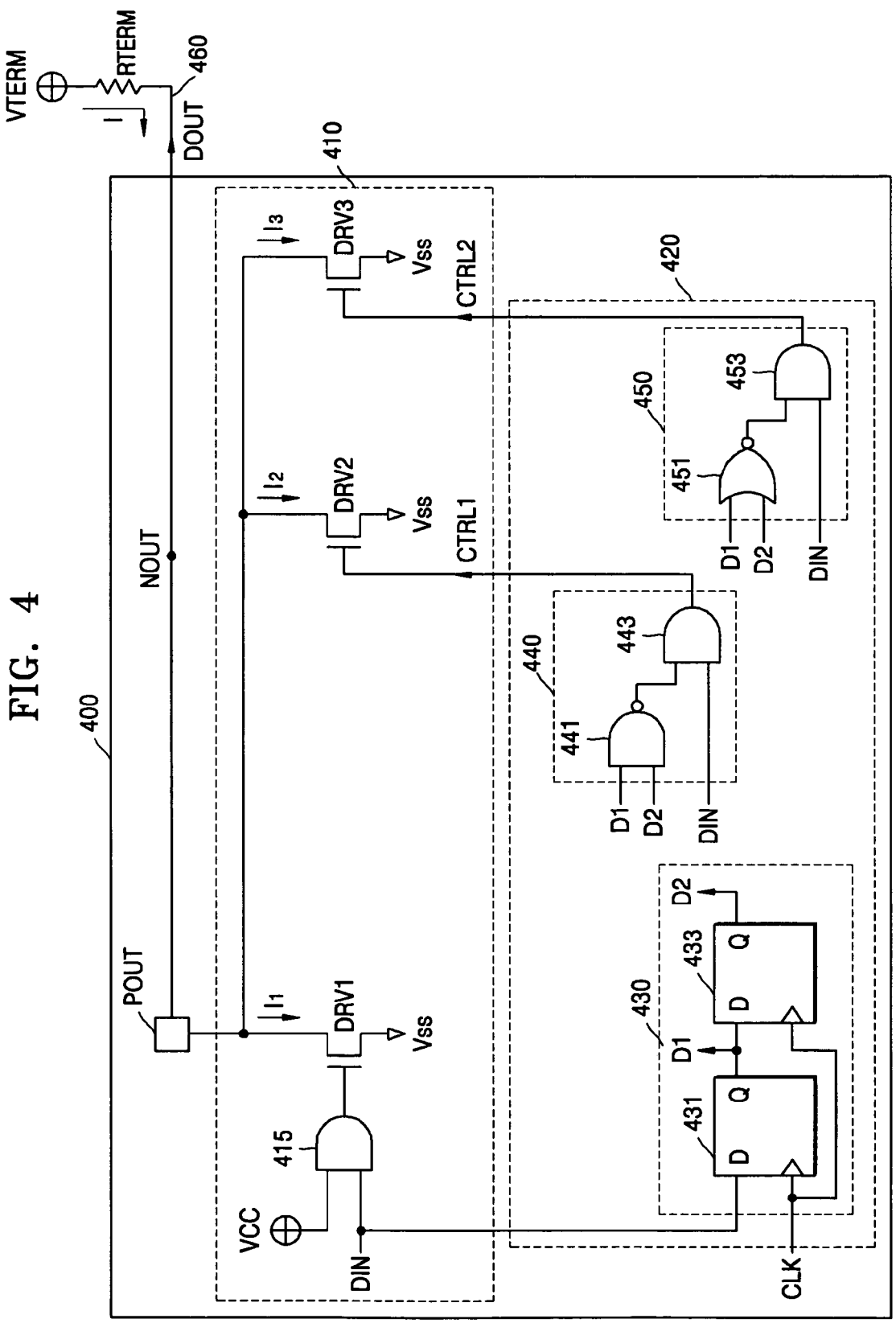
FIG. 4 illustrates a circuit diagram of a first embodiment of an NMOS open drain type output buffer system according to the present invention.

FIG. 4 illustrates a circuit diagram of an embodiment of an NMOS open drain type output buffer system according to the present invention. In this embodiment, a low voltage level as an input voltage DIN represents a logic "0", a high voltage level as an input voltage DIN represents a logic "1", a low voltage level as an output data DOUT represents a logic "1", and a high voltage level as an output data DOUT represents a logic "0". A low voltage level means a voltage low enough to turn off an NMOS transistor, and a high voltage level means a voltage high enough to turn on an NMOS transistor.

As shown in FIG. 4, the NMOS open drain type output buffer system includes an NMOS open drain type output buffer 400 having an output pad POUT. The output pad POUT is connected via an output node NOUT and a channel 460 to a power supply Vterm (called a termination power) via a termination resistor Rterm. The channel 460 represents, for example, a bus or a portion of a bus, over which a device including the open drain type output buffer 400 and other devices (not shown) communicate.

The NMOS open-drain type output buffer 400 includes the output pad POUT, a driver circuit 410, and a control circuit 420. The output node NOUT is anywhere on the channel 460. The voltage of the output node NOUT is that of the output pad POUT.

The control circuit 420 includes a first determining control circuit 440, a second determining control circuit 450 and a latch circuit 430. The control circuit 420 receives input data DIN per clock edge of a clock CLK and generates a first control signal CTRL1 and a second control signal CTRL2 to partially control operation of the driver circuit 410.

The latch circuit 430 includes a first latch 431 and a second latch 433. The first and second latches 431 and 433 are D-type edge-triggered flip-flops and latch at their input D per clock edge of the clock CLK. The first latch 431 latches the input data DIN per the clock edge of clock CLK and outputs a first output signal D1. The second latch 433 latches the first output signal D1 per clock edge of the clock CLK and outputs a second output signal D2. Accordingly, with respect to a current input data DIN, the first and second output signals D1 and D2 represent the two previous input data DIN.

The first determining control circuit 440 includes a NAND gate 441 and an AND gate 443. The input signals of the NAND gate 441 are the first output signal D1 and the second output signal D2 of the latch circuit 430. The AND gate 443 receives the output of the NAND gate 441 and the input data DIN, and generates the first control signal CTRL1.

The first determining control circuit 440 generates the first control signal CTRL1 of low voltage level when the first and second output signals D1 and D2 are logic "1" (high voltage levels in this embodiment), irrespective of the current logic value of the input data DIN. When either of the logic values of the first and second output signals D1 and D2 is a logic "0" (low voltage level in this embodiment), the voltage level of the first control signal CTRL1 is based on the logic value of the input data DIN. Namely, if the input data DIN has logic value "0", then the first control signal CTRL1 is a low voltage, and if the input data DIN has logic value "1", then the first control signal CTRL1 is a high voltage.

The second determining control circuit 450 includes a NOR gate 451 and an AND gate 453. The input signals of the NOR gate 451 are the first and second output signal D1 and D2 of the latch circuit 430. The AND gate 453 receives the output of the NOR gate 451 and the input data DIN, and generates the second control signal CTRL2.

The second determining control circuit 450 generates the second control signal CTRL2 of high voltage level when the first and second output signals D1 and D2 are logic value "0"s and the logic value of the input data DIN is "1". When the logic value of the first and second output signals D1 and D2 are not both logic value "0"s or the logic value of input data DIN is not "1", the second control signal CTRL2 is a low voltage.

The driver circuit 410 includes a first driver DRV1, a second driver DRV2, and a third driver DRV3. The drivers DRV1, DRV2 and DRV3 are connected between the output node NOUT and the ground power VSS in parallel. The drivers DRV1, DRV2 and DRV3 control the voltage level of the output node NOUT according to the input data DIN and the first and second control signals CTRL1 and CTRL2.

The first driver DRV1 is an NMOS transistor having a first gate width size. The source and drain of the NMOS transistor are coupled to the ground power VSS and the output node NOUT, respectively. The gate of the NMOS transistor for the first driver DRV1 is coupled to the input data DIN via an AND gate 415. The AND gate 415 ANDs the input data DIN with a power supply voltage VCC. Accordingly, when the device including the open drain type output buffer is off, the first driver DRV1 is off. More particularly, however, the AND gate 415 serves as a delay so that the input data DIN reaching the gate of the first driver DRV1 is offset from the first and second control signals CTRL1 and CTRL2 reaching the second and third drivers DRV2 and DRV3, respectively.

When the logic value of the input data DIN is "1", the first driver DRV1 drives a first pull-down current I1 from the output node NOUT to the ground power VSS. The level of the output voltage DOUT generated by this pull down operation is VOL=Vterm−I1*Rterm.

Figure 1A:
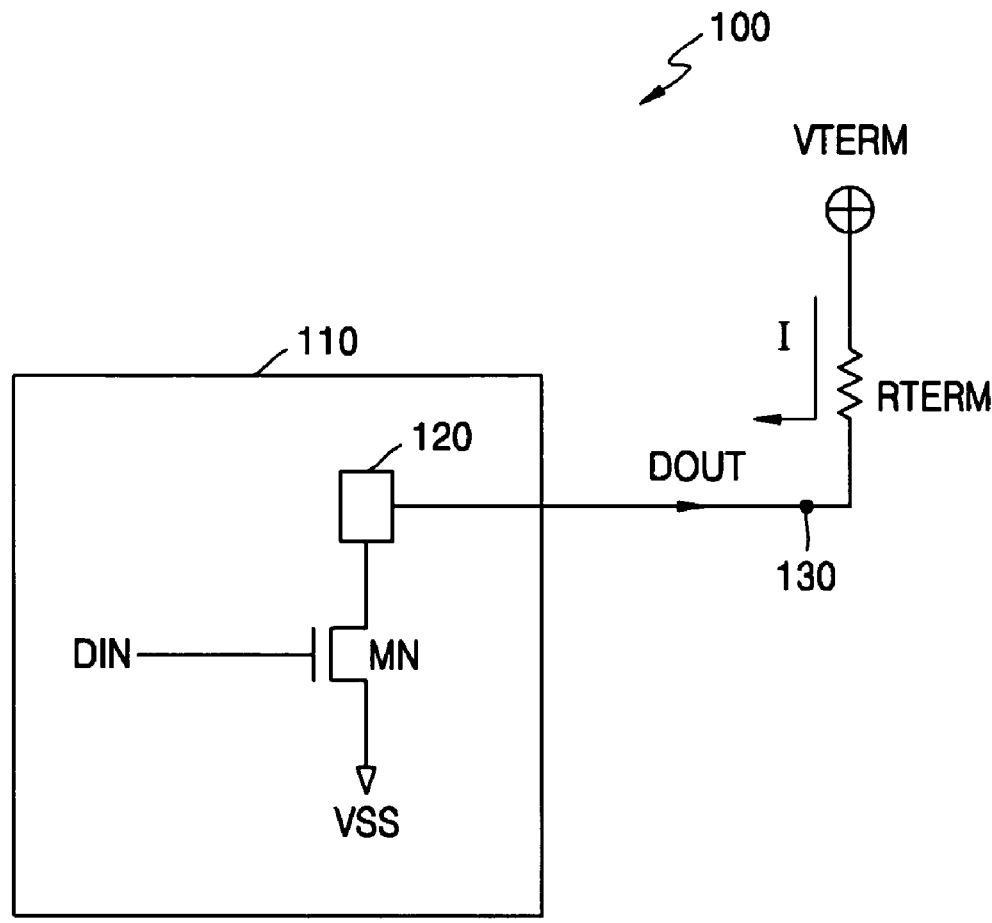
FIG. 1(a) illustrates a circuit diagram of a prior art NMOS open drain type output buffer system.

The second driver DRV2 is an NMOS transistor having a second gate width size. The second gate width size is less than the first gate width size. The source, drain and gate of the NMOS transistor are coupled to the ground power VSS, the output node NOUT and the output of the first determining control circuit 440, respectively. When the first control signal CTRL1 is a high voltage (e.g., logic "1"), the second driver DRV2 drives a second pull-down current I2 from the output node NOUT to the ground power VSS. The level of the output voltage DOUT generated by this pull down operation is VOL=Vterm−I2*Rterm. Accordingly, when both the first and second drivers DRV1 and DRV2 are turned on, the level of the output voltage DOUT becomes VOL=Vterm−I1*Rterm−I2*Rterm. In one exemplary embodiment of the present invention, the first and second gate width sizes are established such that the data output DOUT voltage achieved when the first and second drivers DRV1 and DRV2 are turned on is substantially equal to the low voltage VOL of the output data in the prior art open drain type output buffer of FIG. 1(a). As will be appreciated from the description in this application, the gate width sizes chosen for the first and second drivers DRV1 and DRV2 are design parameters established based on the application of the open drain type output buffer. However, in one exemplary embodiment, the gate width sizes where established so that I1=25 mA and I2=5 mA.

The third driver DRV3 is an NMOS transistor having a third gate width size, which is less than the first gate width size. The source, drain and gate of the NMOS transistor are coupled to the ground power VSS, the output node NOUT and the output of the second determining control circuit 450, respectively. When the second control signal CTRL2 is a high voltage (e.g., logic "1"), the third driver DRV3 drives a third pull-down current I3 from the output node NOUT to the ground power VSS. The level of the output voltage DOUT generated by this pull down operation is Vterm−I3*Rterm. Accordingly, when the first, second and third drivers DRV1, DRV2 and DRV3 are turned on, the level of the output voltage DOUT becomes VOL=Vterm−I1*Rterm−I2*Rterm−I3*Rterm.

Figure 5:
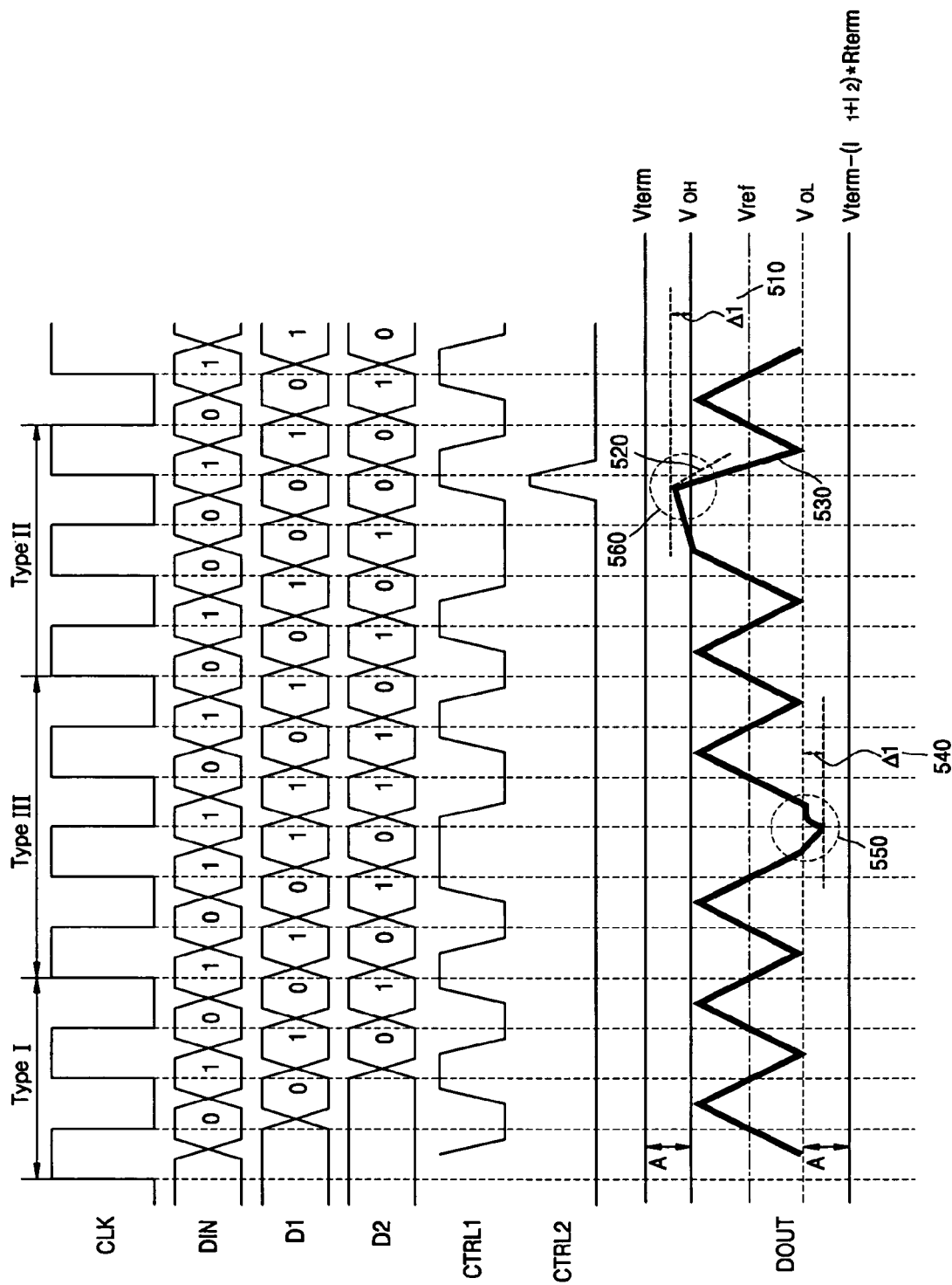
FIG. 5 illustrates the voltage variation in the output data DOUT generated by the open drain type output buffer of FIG. 4 for exemplary input data DIN.

Exemplary operation of the open drain type output buffer according to the present invention will now be described with reference to FIG. 5. FIG. 5 illustrates the voltage variation in the output data DOUT generated by the open drain type output buffer of FIG. 4 for exemplary input data DIN. The voltage level at the output node NOUT is determined by the combination of the pull-down currents I1, I2 and I3 driven by the first driver DRV1, the second driver DRV2 and DRV3, respectively.

A First Case—The Output Data DOUT Toggles Between a High Voltage Level and a Low Voltage Level As indicated under Type I in FIG. 5, in the embodiment of FIG. 4, the output data DOUT toggles between a high voltage level and a low voltage level when the logic value of the input data DIN repeats "0" and "1" (i.e., toggles between a low voltage level and a high voltage level). As a result, the outputs of the latch circuit 430, which are the first and second output signals D1 and D2, are different. The output of the NOR gate 451 is thus a logic "0" such that the logic value of the second control signal CTRL2 is "0" regardless of the logic value of the input data DIN. Therefore, the third driver DRV3 is in a turned-off state regardless of the logic value of the input data DIN.

When the logic value of the input data DIN repeats "0" and "1", the logic value of the NAND gate 441 is "1". Accordingly, the logic value of the first control signal CTRL1 is determined by the logic value of the input data DIN. For example, when the logic value of the input data DIN is "1", the logic value of the first control signal CTRL1 is "1" (a high voltage level) and when the logic value of the input data DIN is "0", the logic value of the first control signal CTRL1 is "0" (a low voltage level). Therefore, the second driver DRV2 is in a turned-on state when the input data DIN is logic value "1", and is in a turned-off state when the input data DIN is logic value "0".

Similarly, the state of the first driver DRV1 is controlled by the input data DIN such that the first driver DRV1 is in a turned-on state when the input data DIN is logic value "1", and is in a turned-off state when the input data DIN is logic value "0".

In view of the above, when the logic value of the input data DIN repeats "0" and "1", the output voltage DOUT is driven to the high voltage level VOH=Vterm when the input data DIN is logic value "0". When the input data DIN is logic vaue "1", the logic value of the control signals CTRL1 and CTRL2 are "1" and "0", respectively, so that the output voltage DOUT is driven to the low voltage level VOL=Vterm−(I1+I2)*Rterm due to the turned-on state of the first and second drivers DRV1 and DRV2. However, the voltage swing of the output data DOUT is VOH=Vterm−A and VOL=Vterm−(I1+I2)*Rterm+A due to the channel attenuation A.

A Second Case—The Output Data DOUT Transitions from Two Successive High Voltage Level Data to a Low Voltage Level Data As indicated under Type II in FIG. 5, in the embodiment of FIG. 4, the output data DOUT transitions from two successive high voltage level data to a low voltage level data when the logic value of the input data DIN transitions from two successive "0"s to a "1" (i.e., transitions from two successive low voltage level data to high voltage level data). When the logic values of the input data DIN are two successive "0"s, the output signals D1 and D2 of the latch circuit 430 are logic value "0"s. Referring to the dashed circle 560 in FIG. 5, the high voltage level of the output data DOUT for the second bit of the two successive "0"s is VOH=Vterm−A+Δ1 due to the decrease in the channel attenuation from A to A−Δ1.

When the output signals D1 and D2 of latch circuit 430 are both "0"s, the logic value of the NOR gate 451 is "1" so that the logic value (or voltage level) of the second control signal CTRL2 is determined by the logic value of the input data DIN. For example, when the logic value of the input data DIN is "1", the logic value of the second control signal CTRL2 is "1", and when the logic value of the input data DIN is "0", the logic value of the second control signal CTRL2 is "0". Accordingly, a transition from two success "0"s to a "1" in the input data DIN causes the second control signal CTRL2 to achieve a high voltage level.

When the output signals D1 and D2 of latch circuit 430 are "0"s, the logic value of the NAND gate 441 is "1" so that the logic value of the first control signal CTRL1 is determined by the logic value of the input data DIN. For example, when the logic value of the input data DIN is "1", the logic value of the first control signal CTRL1 is "1" and when the logic value of the input data DIN is "0", the logic value of the first control signal CTRL1 is "0".

Accordingly, as shown in FIG. 5, when the input data DIN transitions from two successive "0"s to "1", the first control signal CTRL1 and the second control signal CTRL2 are at a high voltage level (e.g., logic value "1") so that the first, second and third drivers DRV1, DRV2 and DRV3 are in the turned-on state and drive the total current of I1+I2+I3. The output voltage at the output node NOUT is Vterm−(I1+I2+I3)*Rterm due to the total current of I1+I2+I3.

Referring to the dashed circle 560 in FIG. 5, when the output data DOUT is at a high voltage level for two successive data and then transitions to low voltage level, the first, second and third drivers DRV1, DRV2 and DRV3 are turned on so that the slope of the transition increases from 520 (slope when in Type 1 of FIG. 5) to 530. As a result, the output data DOUT reaches approximately VOL within the bit time, and skew in the transition time is mitigated.

Namely, having the additional third driver DRV3 turn on compensates for the output voltage variation Δ1 510 in the output data DOUT due to the ISI so that the output data DOUT swings from VOH=Vterm−A+Δ1 to VOL=Vterm−(I1+I2) when the output data DOUT is at a high voltage level for two successive data and then transitions to a low voltage level (e.g., detected when the input data DIN transitions from two successive logic "0"s to "1").

A Third Case—The Output Data DOUT Includes Two Successive Low Voltage Level Data.

As indicated as type III of FIG. 5, in the embodiment of FIG. 4, the output data DOUT includes two successive low voltage level data when the logic value of the input data DIN includes two successive logic "1"s (i.e., includes two successive high voltage level data). When the logic values of the input data DIN are two successive logic "1"s, the output signals D1 and D2 of the latch circuit 430 become logic value "1"s. Referring to the dashed circle 550 in FIG. 5, the voltage level of the output data DOUT for the second bit of the two successive "1"s is VOL=Vterm−(I1+I2)*Rterm−Δ1 due to the decrease of the channel attenuation from A to A−Δ1.

When the output signals D1 and D2 of latch circuit 430 are "1"s, the logic value of the NOR gate 451 is "0" so that the logic value of the second control signal CTRL2 is "0" regardless of the logic value of the input data DIN. Also, the logic value of the NAND gate 441 is "0" so that the logic value of the first control signal CTRL1 is "0" regardless of the logic value of the input data DIN.

As a result, prior to the next output data DOUT following the two successive low voltage level output data, the logic value of the first control signal CTRL1 changes to "0" so that the second driver DRV2 is placed in the turned-off state. The total pull-down current reduces from I1+I2 to I1. As shown in the dashed circle 550 in FIG. 5, the voltage level of the output data DOUT increases from Vterm−(I1+I2)*Rterm to Verm−I1*Rterm due to the decreased pull-down current. In an exemplary embodiment of the present invention, the second channel width size is selected such that the increase in the output data voltage level is equal to Δ1.

Consequently, if the next output data DOUT is a high voltage level data as shown in FIG. 5, the first driver DRV1 becomes placed in the turned-off state because the input data DIN transitions from logic value "1" to "0". This drives the output voltage of the output data DOUT to Vterm from Vterm−I1*Rterm. Because the transition to a high voltage level begins from the elevated low voltage level, the detrimental impact of ISI is mitigated.

Second Embodiment

Figure 6:
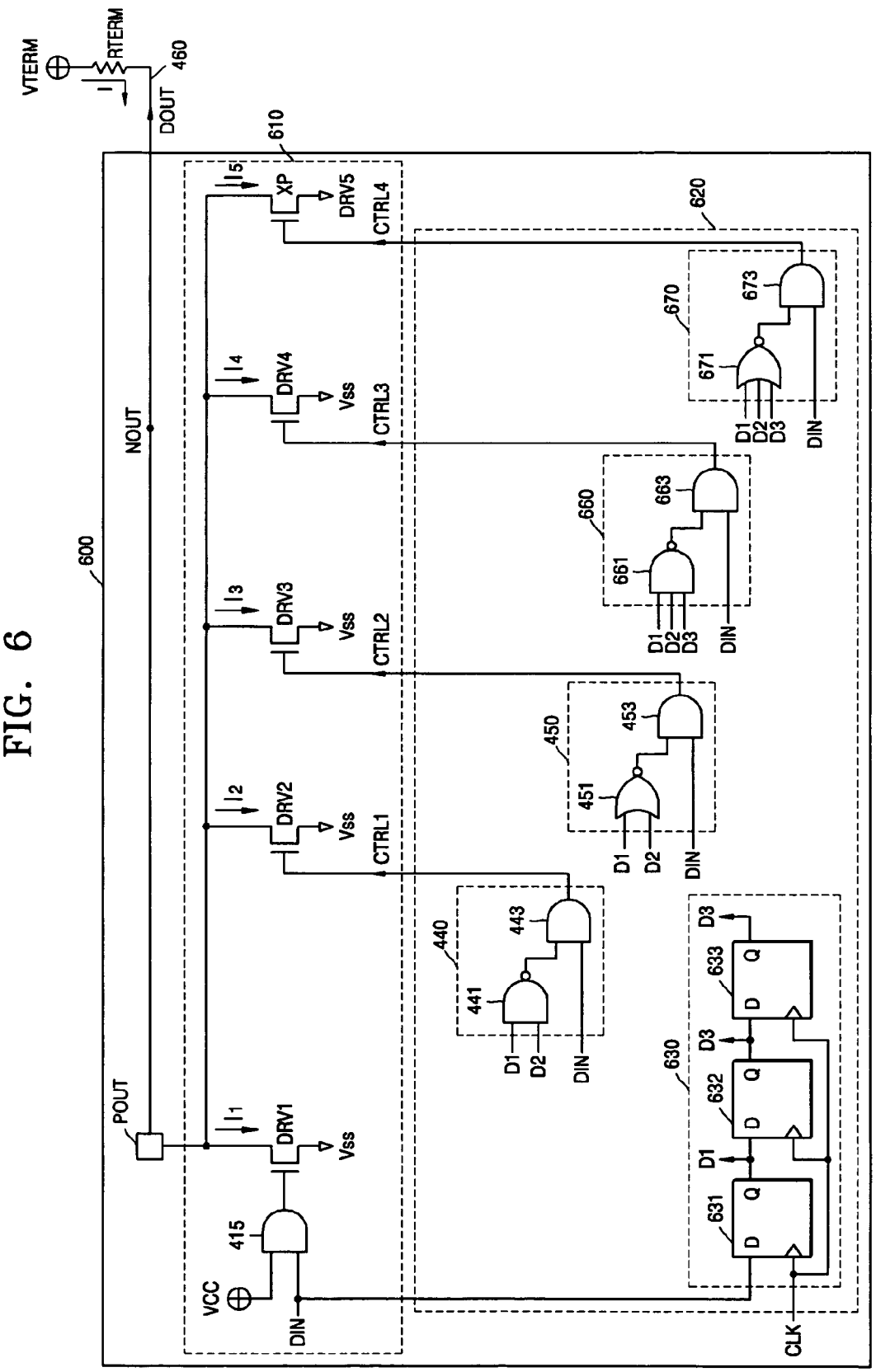
FIG. 6 each illustrates a circuit diagram of a second embodiment of an open drain type output buffer according to the present invention.

FIG. 6 illustrates a circuit diagram of another embodiment of an NMOS open drain type output buffer system according to the present invention. In this embodiment, a low voltage level as an input voltage DIN represents a logic "0", a high voltage level as an input voltage DIN represents a logic "1", a low voltage level as an output data DOUT represents a logic "1", and a high voltage level as an output data DOUT represents a logic "0". A low voltage level means a voltage low enough to turn off an NMOS transistor, and a high voltage level means a voltage high enough to turn on an NMOS transistor.

As shown in FIG. 6, the NMOS open drain type output buffer system includes an NMOS open drain type output buffer 600 having an output pad POUT. The output pad POUT is connected via an output node NOUT and a channel 460 to a power supply Vterm (called a termination power) via a termination resistor Rterm. The channel 460 represents, for example, a bus or a portion of a bus, over which a device including the open drain type output buffer 600 and other devices (not shown) communicate.

The NMOS open drain type output buffer 600 includes the output pad POUT, a driver circuit 610, and a control circuit 620. The output node NOUT is anywhere on the channel 460. The voltage of the output node NOUT is that of the output pad POUT.

The control circuit 620 includes a first determining control circuit 440, a second determining control circuit 450, a third determining control circuit 660, a fourth determining control circuit 670 and a latch circuit 630. The control circuit 420 receives input data DIN per clock edge of a clock CLK and generates a first control signal CTRL1, a second control signal CTRL2, a third control signal CTRL3 and a fourth control signal CTRL4 to partially control operation of the driver circuit 610.

The latch circuit 630 includes a first latch 631, a second latch 632 and a third latch 633. These latches 631, 632 and 633 are D-type edge-triggered flip-flops and latch their input D per clock edge of the clock CLK. The first latch 631 latches the input data DIN per the clock edge of clock CLK and outputs a first output signal D1. The second latch 632 latches the first output signal D1 per clock edge of the clock CLK and outputs a second output signal D2. The third latch 633 latches the second output signal D2 per clock edge of the clock CLK and outputs a third output signal D3. Accordingly, with respect to a current input data DIN, the first, second and third output signals D1, D2 and D3 represent the three previous input data DIN.

The operation and structure of the first and second determining control circuits 440 and 450 are the same as that described above with respect to FIG. 4. Therefore a description of these circuits will not be repeated for the sake of brevity.

The third determining control circuit 660 includes a NAND gate 661 and an AND gate 663. The input signals of the NAND gate 661 are the first, second and third output signals D1, D2 and D3 of the latch circuit 630. The AND gate 663 receives the output of the NAND gate 661 and the input data DIN, and generates the third control signal CTRL3.

The third determining control circuit 660 generates the third control signal CTRL3 of low voltage level when the first, second and third output signals D1, D2 and D3 are logic "1" (high voltage levels in this embodiment), irrespective of the logic value of the input data DIN. When any of the logic values of the first, second and third output signals D1, D2 and D3 is a logic "0" (low voltage level in this embodiment), the voltage level of the third control signal CTRL3 is based on the logic value of the input data DIN. Namely, if the input data DIN has logic value "0", then the third control signal CTRL3 is a low voltage, and if the input data DIN has logic value "1", then the third control signal CTRL3 is a high voltage.

The fourth determining control circuit 670 includes a NOR gate 671 and an AND gate 673. The input signals of the NOR gate 671 are the first, second and third output signals D1, D2 and D3 of the latch circuit 630. The AND gate 673 receives the output of the NOR gate 671 and the input data DIN, and generates the fourth control signal CTRL4.

The fourth determining control circuit 670 generates the fourth control signal CTRL4 of high voltage level when the first, second and third output signals D1, D2 and D3 are logic value "0"s and the logic value of the input data DIN is "1". When the logic value of the first, second and third output signals D1, D2 and D3 are not all logic value "0"s or the logic value of input data DIN is not "1", the fourth control signal CTRL4 is a low voltage.

The driver circuit 610 includes the first driver DRV1, the second driver DRV2, the third driver DRV3, a fourth driver DRV4 and a fifth driver DR5. The drivers DRV1–DRV5 are connected between the output node NOUT and the ground power VSS in parallel. The drivers DRV1–DRV5 control the voltage level of the output node NOUT according to the input data DIN and the first-fourth control signals CTRL1–CTRL4.

The first driver DRV1 is an NMOS transistor having a first gate width size. The source and drain of the NMOS transistor are coupled to the ground power VSS and the output node NOUT, respectively. The gate of the NMOS transistor for the first driver DRV1 is coupled to the input data DIN via an AND gate 415. The AND gate 415 ANDs the input data DIN with a power supply voltage VCC Accordingly, when the device including the open drain type output buffer is off, the first driver DRV1 is off. More particularly, however, the AND gate 415 serves as a delay so that the input data DIN reaching the gate of the first driver DRV1 is offset from the first-fourth control signals CTRL1-CTRI4 reaching the second-fifth drivers DRV2–DRV5, respectively.

When the logic value of the input data DIN is "1", the first driver DRV1 drives a first pull-down current I1 from the output node NOUT to the ground power VSS. The level of the output voltage DOUT generated by this pull down operation is VOL=Vterm−I1*Rterm.

The second and fourth drivers DRV2 and DRV4 are NMOS transistors having second and fourth gate width sizes, respectively. The second and fourth gate width sizes are less than the first gate width size. The source, drain and gate of the NMOS transistor for the second driver DRV2 are coupled to the ground power VSS, the output node NOUT and the output of the first determining control circuit 440, respectively. The source, drain and gate of the NMOS transistor for the fourth driver DRV4 are coupled to the ground power VSS, the output node NOUT and the output of the third determining control circuit 660, respectively.

As stated previously with respect to the embodiment of FIG. 4, when the logic value of the first control signal CTRL1 is "1", the second driver DRV2 drives a second pull-down current 12 from the output node NOUT to the ground power VSS. The level of the output voltage DOUT generated by this pull down operation is VOL=Vterm−I2*Rterm. Similarly, when the logic value of the third control signal CTRL3 is "1", the fourth driver DRV4 drives a fourth pull-down current I4 from the output node NOUT to the ground power VSS. The level of the output voltage DOUT generated by this pull down operation is VOL=Vterm−I4*Rterm.

Accordingly, when the first, second and fourth drivers DRV1, DRV2 and DRV4 are turned on, the level of the output voltage DOUT becomes VOL=Vterm−I1*Rterm−I2*Rterm−I4*Rterm. In one exemplary embodiment of the present invention, the first, second and fourth gate width sizes are established such that the data output DOUT voltage achieved when the first, second and fourth drivers DRV1, DRV2 and DRV4 are turned on is substantially equal to the low voltage VOL of the output data in the prior art open drain type output buffer of FIG. 1(a). As will be appreciated from the description in this application, the gate width sizes chosen for the first, second and fourth drivers DRV1, DRV2 and DRV4 are design parameters established based on the application of the open drain type output buffer. As described above with respect to FIG. 4, an exemplary second driver DRV2, in transitioning from a turned-on to a turned-off state compensates for additional attenuation caused by ISI when two successive low voltage output data DOUT are generated. Likewise, an exemplary embodiment of the fourth driver DRV4, in transitioning from a turned-on state to a turned-off state compensates for the further additional attenuation caused by ISI when three successive low voltage output data DOUT are generated.

The third and fifth drivers DRV3 and DRV5 are NMOS transistors having third and fifth gate width sizes, which are less than the first gate width size. The source, drain and gate of the NMOS transistor in the third driver DRV3 are coupled to the ground power VSS, the output node NOUT and the output of the second determining control circuit 450, respectively. The source, drain and gate of the NMOS transistor in the fifth driver DRV5 are coupled to the ground power VSS, the output node NOUT and the output of the fourth determining control circuit 670, respectively. When the logic value of the second control signal CTRL2 is a high voltage, the third driver DRV3 drives a third pull-down current 13 from the output node NOUT to the ground power VSS. The level of the output voltage DOUT generated by this pull down operation is Vterm−I3*Rterm. When the logic value of the fourth control signal CTRL4 is a high voltage, the fifth driver DRV5 drives a fifth pull-down current 15 from the output node NOUT to the ground power VSS. The level of the output voltage DOUT generated by this pull down operation is Vterm−I5*Rterm.

Exemplary operation of the open drain output buffer according to the present invention will be readily understood from the previous discussion of the embodiment of FIG. 4 with respect to FIG. 5. Namely, the second and third drivers DRV2 and DRV3 are controlled by the first and second determining control circuits 440 and 450 in the same manner as discussed above with respect to the embodiment of FIG. 4. The fourth driver DRV4 is controlled by the third determining control circuit 660 in the same manner that the first determining control circuit 440 controls the second driver DRV2, except that the control is based upon the output data DOUT having been at a low voltage level for three successive output data (i.e., three successive "1"s in the input data DIN). Similarly, the fifth driver DRV5 is controlled by the fourth determining control circuit 670 in the same manner that the second determining control circuit 450 controls the third driver DRV3, except that the control is based on the output data DOUT transitioning from three high voltage level data to a low voltage level data (i.e., transitioning from three successive "0"s to a "1" in the input data DIN).

Third Embodiment

Figure 7:
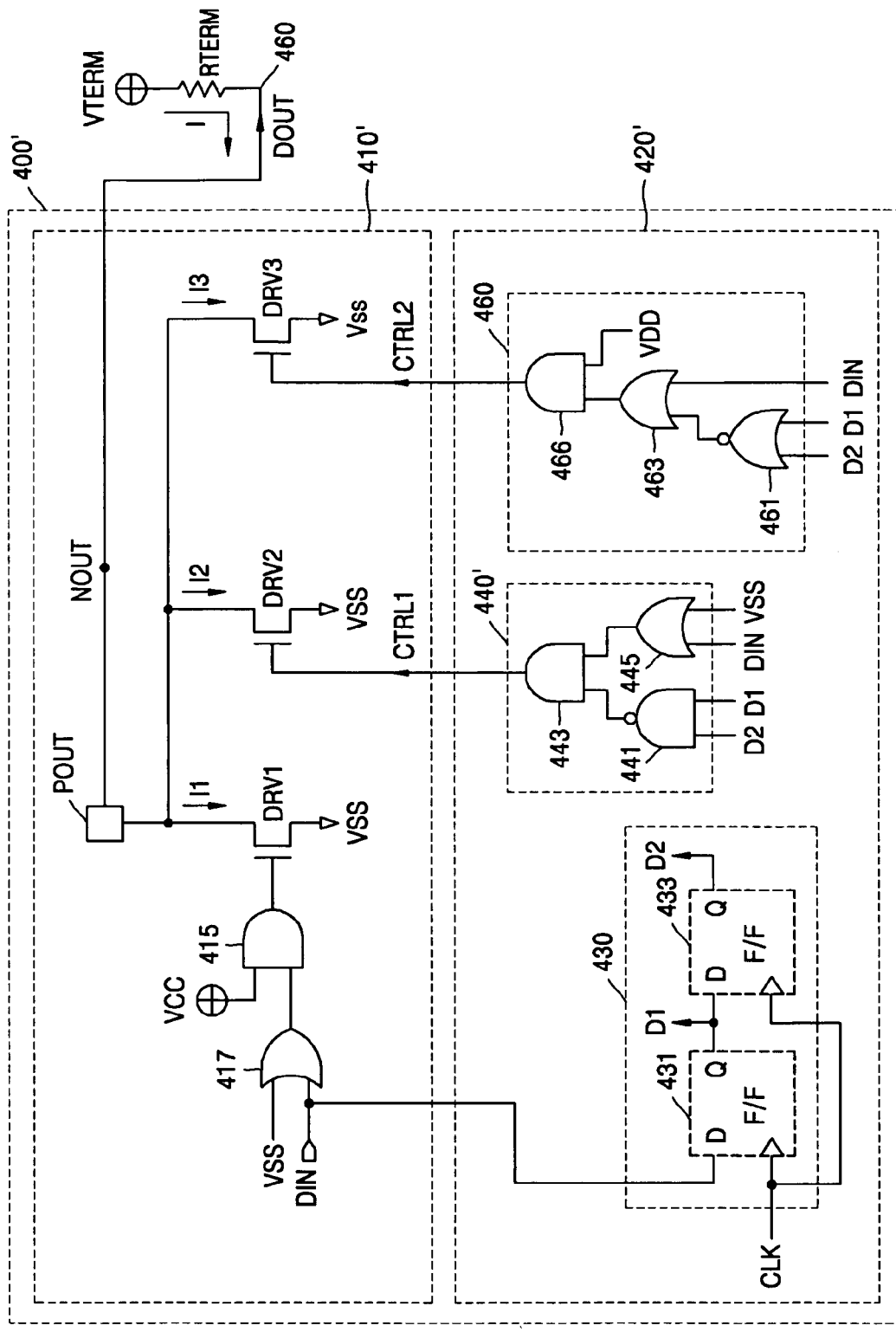
FIG. 7 illustrates a circuit diagram of a third embodiment of an NMOS open drain type output buffer system according to the present invention.

FIG. 7 illustrates a circuit diagram of an embodiment of an NMOS open drain type output buffer system according to the present invention. In this embodiment, a low voltage level as an input voltage DIN represents a logic "0", a high voltage level as an input voltage DIN represents a logic "1", a low voltage level as an output data DOUT represents a logic "1", and a high voltage level as an output data DOUT represents a logic "0". A low voltage level means a voltage low enough to turn off an NMOS transistor, and a high voltage level means a voltage high enough to turn on an NMOS transistor.

As shown in FIG. 7, the NMOS open drain type output buffer system includes an NMOS open drain type output buffer 400' having an output pad POUT. The output pad POUT is connected via an output node NOUT and a channel 460 to a power supply Vterm (called a termination power) via a termination resistor Rterm. The channel 460 represents, for example, a bus or a portion of a bus, over which a device including the open drain type output buffer 400' and other devices (not shown) communicate.

The NMOS open-drain type output buffer 400' includes the output pad POUT, a driver circuit 410', and a control circuit 420'. The output node NOUT is anywhere on the channel 460. The voltage of the output node NOUT is that of the output pad POUT.

The control circuit 420' includes a first determining control circuit 440', a second determining control circuit 460 and a latch circuit 430. The control circuit 420' receives input data DIN per clock edge of a clock CLK and generates a first control signal CTRL1 and a second control signal CTRL2 to partially control operation of the driver circuit 410'.

The latch circuit 430 includes a first latch 431 and a second latch 433. The first and second latches 431 and 433 are D-type edge-triggered flip-flops and latch at their input D per clock edge of the clock CLK. The first latch 431 latches the input data DIN per the clock edge of clock CLK and outputs a first output signal D1. The second latch 433 latches the first output signal D1 per clock edge of the clock CLK and outputs a second output signal D2. Accordingly, with respect to a current input data DIN, the first and second output signals D1 and D2 represent the two previous input data DIN.

The first determining control circuit 440' includes a NAND gate 441, an OR gate 445 and an AND gate 443. The input signals of the NAND gate 441 are the first output signal D1 and the second output signal D2 of the latch circuit 430. The input signals of the OR gate 445 are the input data DIN and a low voltage reference potential (e.g., ground) VSS. As will be appreciated, because the OR gate 445 logic-ORs the input data DIN with a logic low signal, the output of the OR gate 445 will be the input data DIN. The OR gate 445 serves as a delay to promote proper timing in the buffer 400'. The AND gate 443 receives the output of the NAND gate 441 and the input data DIN output from the OR gate 445, and generates the first control signal CTRL1.

The first determining control circuit 440' generates the first control signal CTRL1 of low voltage level when the first and second output signals D1 and D2 are logic "1" (high voltage levels in this embodiment), irrespective of the current logic value of the input data DIN. When either of the logic values of the first and second output signals D1 and D2 is a logic "0" (low voltage level in this embodiment), the voltage level of the first control signal CTRL1 is based on the logic value of the input data DIN. Namely, if the input data DIN has logic value "0", then the first control signal CTRL1 is a low voltage, and if the input data DIN has logic value "1", then the first control signal CTRL1 is a high voltage.

The second determining control circuit 460 includes a NOR gate 461, an OR gate 463 and an AND gate 465. The input signals of the NOR gate 461 are the first and second output signal D1 and D2 of the latch circuit 430. The OR gate 463 receives the output of the NOR gate 461 and the input data DIN. The AND gate 465 receives the output of the OR gate 463 and a high voltage reference potential (e.g., a power supply voltage) VDD, and generates the second control signal CTRL2. As will be appreciated, the AND gate 465 outputs the voltage or logic value from the OR gate 463. The AND gate 465 serves as a delay to promote proper timing in the buffer 400'.

The second determining control circuit 460 generates the second control signal CTRL2 of high voltage level when the first and second output signals D1 and D2 are logic "0" (low voltage levels in this embodiment), irrespective of the current logic value of the input data DIN. When either of the logic values of the first and second output signals D1 and D2 is a logic "1" (high voltage level in this embodiment), the voltage level of the second control signal CTRL2 is based on the logic value of the input data DIN. Namely, if the input data DIN has logic value "0", then the second control signal CTRL2 is a low voltage, and if the input data DIN has logic value "1", then the second control signal CTRL2 is a high voltage.

The driver circuit 410' includes a first driver DRV1, a second driver DRV2, and a third driver DRV3. The drivers DRV1, DRV2 and DRV3 are connected between the output node NOUT and the ground power VSS in parallel. The drivers DRV1, DRV2 and DRV3 control the voltage level of the output node NOUT according to the input data DIN and the first and second control signals CTRL1 and CTRL2.

The first driver DRV1 is an NMOS transistor having a first gate width size. The source and drain of the NMOS transistor are coupled to the ground power VSS and the output node NOUT, respectively. The gate of the NMOS transistor for the first driver DRV1 is coupled to the input data DIN via an AND gate 415 and an OR gate 417. The OR gate 417 ORs the input data DIN with a low voltage reference potential (e.g., ground) VSS. As such the OR gate 417 outputs the input data DIN. The AND gate 415 ANDs the input data DIN output from the OR gate 417 with a high voltage reference potential (e.g., a power supply voltage) VCC. Accordingly, when the device including the open drain type output buffer is off, the first driver DRV1 is off. More particularly, however, the OR gate 417 and the AND gate 415 serve as a delay so that the input data DIN reaching the gate of the first driver DRV1 is offset from the first and second control signals CTRL1 and CTRL2 reaching the second and third drivers DRV2 and DRV3, respectively.

When the logic value of the input data DIN is "1", the first driver DRV1 drives a first pull-down current I1 from the output node NOUT to the ground power VSS. The level of the output voltage DOUT generated by this pull down operation is Vterm−I1*Rterm.

The second driver DRV2 is an NMOS transistor having a second gate width size. The second gate width size is less than the first gate width size. The source, drain and gate of the NMOS transistor are coupled to the ground power VSS, the output node NOUT and the output of the first determining control circuit 440', respectively. When the first control signal CTRL1 is a high voltage (e.g., logic "1"), the second driver DRV2 drives a second pull-down current I2 from the output node NOUT to the ground power VSS. The level of the output voltage DOUT generated by this pull down operation is Vterm−I2*Rterm. Accordingly, when both the first and second drivers DRV1 and DRV2 are turned on, the level of the output voltage DOUT becomes Vterm−I1*Rterm−I2*Rterm.

The third driver DRV3 is an NMOS transistor having a third gate width size, which is less than the first gate width size. The source, drain and gate of the NMOS transistor are coupled to the ground power VSS, the output node NOUT and the output of the second determining control circuit 460, respectively. When the second control signal CTRL2 is a high voltage (e.g., logic "1"), the third driver DRV3 drives a third pull-down current I3 from the output node NOUT to the ground power VSS. The level of the output voltage DOUT generated by this pull down operation is Vterm−I3*Rterm. Accordingly, when the first, second and third drivers DRV1, DRV2 and DRV3 are turned on, the level of the output voltage DOUT becomes Vterm−I1*Rterm−I2*Rterm−I3*Rterm. In one exemplary embodiment of the present invention, the first, second and third gate width sizes are established such that the data output DOUT voltage achieved when the first, second and third drivers DRV1, DRV2 and DRV3 are turned on is substantially equal to the low voltage VOL of the output data in the prior art open drain type output buffer of FIG. 1(a). As will be appreciated from the description in this application, the gate width sizes chosen for the first, second and third drivers DRV1, DRV2 and DRV3 are design parameters established based on the application of the open drain type output buffer.

Figure 8:
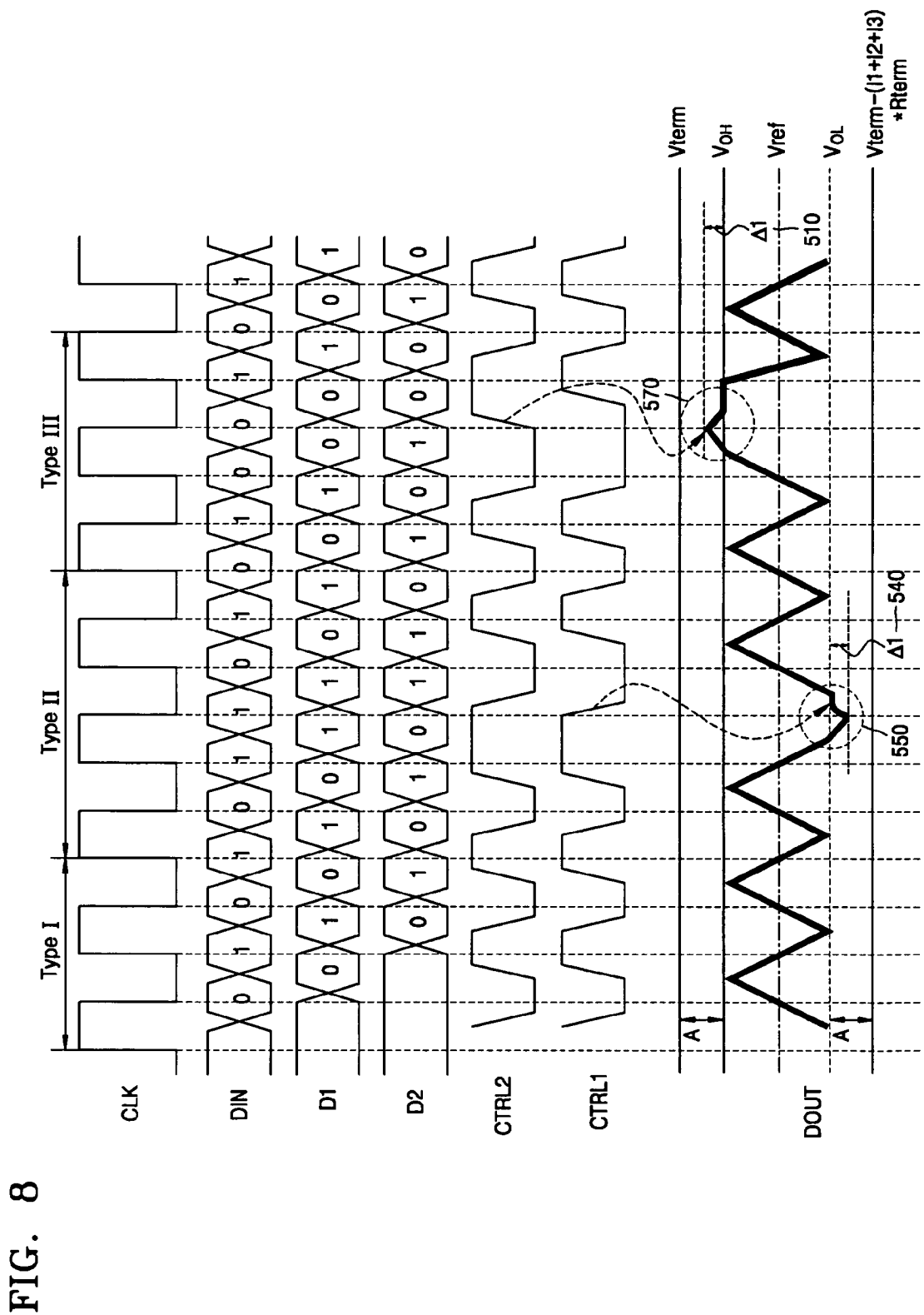
FIG. 8 illustrates the voltage variation in the output data DOUT generated by the open drain type output buffer of FIG. 7 for exemplary input data DIN.

Exemplary operation of the open drain type output buffer according to the present invention will now be described with reference to FIG. 8. FIG. 8 illustrates the voltage variation in the output data DOUT generated by the open drain type output buffer of FIG. 7 for exemplary input data DIN. The voltage level at the output node NOUT is determined by the combination of the pull-down currents I1, I2 and I3 driven by the first driver DRV1, the second driver DRV2 and DRV3, respectively.

A First Case—The Output Data DOUT Toggles Between a High Voltage Level and a Low Voltage Level.

As indicated under Type I in FIG. 8, in the embodiment of FIG. 7, the output data DOUT toggles between a high voltage level and a low voltage level when the logic value of the input data DIN repeats "0" and "1" (i.e., toggles between a low voltage level and a high voltage level). As a result, the outputs of the latch circuit 430, which are the first and second output signals D1 and D2, are different.

When the logic value of the input data DIN repeats "0" and "1", the logic value of the NAND gate 441 is "1". Accordingly, the logic value of the first control signal CTRL1 is determined by the logic value of the input data DIN. For example, when the logic value of the input data DIN is "1", the logic value of the first control signal CTRL1 is "1" (a high voltage level) and when the logic value of the input data DIN is "0", the logic value of the first control signal CTRL1 is "0" (a low voltage level). Therefore, the second driver DRV2 is in a turned-on state when the input data DIN is logic value "1", and is in a turned-off state when the input data DIN is logic value "0".

Also, when the logic value of the input data DIN repeats "0" and "1", the logic value of the NOR gate 461 is "0" and the OR gate 463 passes the input data DIN 463 to the AND gate 465. Accordingly, as discussed above, the logic value of the second control signal CTRL2 is determined by the logic value of the input data DIN. For example, when the logic value of the input data DIN is "1", the logic value of the second control signal CTRL2 is "1" (a high voltage level) and when the logic value of the input data DIN is "0", the logic value of the second control signal CTRL2 is "0" (a low voltage level). Therefore, the third driver DRV3 is in a turned-on state when the input data DIN is logic value "1", and is in a turned-off state when the input data DIN is logic value "0".

Similarly, the state of the first driver DRV1 is controlled by the input data DIN such that the first driver DRV1 is in a turned-on state when the input data DIN is logic value "1", and is in a turned-off state when the input data DIN is logic value "0".

In view of the above, when the logic value of the input data DIN repeats "0" and "1", the output voltage DOUT is driven to the high voltage level VOH=Vterm when the input data DIN is logic value "0". When the input data DIN is logic value "1", the logic value of the control signals CTRL1 and CTRL2 are "1" and "1", respectively, so that the output voltage DOUT is driven to the low voltage level VOL=Vterm−(I1+I2+I3)*Rterm due to the turned-on state of the first, second and third drivers DRV1, DRV2 and DRV3. However, the voltage swing of the output data DOUT is VOH=Vterm−A and VOL=Vterm−(I1+I2+I3)*Rterm+A due to the channel attenuation A.

A Second Case—The Output Data DOUT Includes Two Successive Low Voltage Level Data As indicated as Type II of FIG. 8, in the embodiment of FIG. 7, the output data DOUT includes two successive low voltage level data when the logic value of the input data DIN includes two successive logic "1"s (i.e., includes two successive high voltage level data). When the logic values of the input data DIN are two successive logic "1"s, the output signals D1 and D2 of the latch circuit 430 become logic value "1"s. Referring to the dashed circle 550 in FIG. 8, the voltage level of the output data DOUT for the second bit of the two successive "1"s is VOL=Vterm−(I1+I2+I3)*Rterm+A−Δ1 due to the decrease of the channel attenuation from A to A−Δ1.

When the output signals D1 and D2 of latch circuit 430 are "1"s, the logic value of the NOR gate 461 is "0" so that the logic value of the second control signal CTRL2 follows the logic value of the input data DIN as discussed above. Also, the logic value of the NAND gate 441 is "0" so that the logic value of the first control signal CTRL1 is "0" regardless of the logic value of the input data DIN.

As a result, prior to the next output data DOUT following the two successive low voltage level output data, the logic value of the first control signal CTRL1 changes to "0" so that the second driver DRV2 is placed in the turned-off state. The total pull-down current reduces from I1+I2+I3 to I1+I3. As shown in the dashed circle 550 in FIG. 5, the voltage level of the output data DOUT increases from Vterm−(I1+I2+I3)*Rterm+A−Δ1 to Vterm−(I1+I3)*Rterm+A−Δ1 due to the decreased pull-down current. In an exemplary embodiment of the present invention, the second channel width size is selected such that the increase in the output data voltage level is equal to Δ1.

Consequently, if the next output data DOUT is a high voltage level data as shown in FIG. 8, the first and third drivers DRV1 and DRV3 become placed in the turned-off state because the input data DIN transitions from logic value "1" to "0". This drives the output voltage of the output data DOUT to Vterm from Vterm−(I1+I3)*Rterm. Because the transition to a high voltage level begins from the elevated low voltage level, the detrimental impact of ISI is mitigated.

A Third Case—The Output Data DOUT Includes Two Successive High Voltage Level Data As indicated as Type III of FIG. 8, in the embodiment of FIG. 7, the output data DOUT includes two successive high voltage level data when the logic value of the input data DIN includes two successive logic "0"s (i.e., includes two successive low voltage level data). When the logic values of the input data DIN are two successive logic "0"s, the output signals D1 and D2 of the latch circuit 430 become logic value "0"s. Referring to the dashed circle 570 in FIG. 8, the voltage level of the output data DOUT for the second bit of the two successive "0"s is VOH=Vterm−A+Δ1 due to the change in the channel attenuation from −A to −A+Δ1.

When the output signals D1 and D2 of latch circuit 430 are "0"s, the logic value of the NAND gate 441 is "1" so that the logic value of the first control signal CTRL1 follows the logic value of the input data DIN as discussed above. The logic value of the NOR gate 461 is "1" when the output signals D1 and D2 of latch circuit 430 are "0"s, and the output of the OR gate 463 is "1" regardless of the logic value of the input data DIN. The output of the AND gate 465, the second control signal CTRL2, is "1" regardless of the logic value of the input data DIN, and the third driver DRV3 turns on.

As a result, prior to the next output data DOUT following the two successive high voltage level output data, the logic value of the second control signal CTRL2 changes to "1" so that the second driver DRV2 is placed in the turned-on state. A pull-down current of I3 is thus generated. As shown in the dashed circle 570 in FIG. 8, the voltage level of the output data DOUT decreases from Vterm−A+Δ1 to Vterm−(I3)*Rterm−A+Δ1 due to the pull-down current. In an exemplary embodiment of the present invention, the third channel width size is selected such that the decrease in the output data voltage level is equal to Δ1.

Consequently, if the next output data DOUT is a low voltage level data as shown in FIG. 8, the first, second and third drivers DRV1, DRV2 and DRV3 become placed in the turned-on state because the input data DIN transitions from logic value "0" to "1". This drives the output voltage of the output data DOUT from Vterm−(I3)*Rterm−A+Δ1 to Vterm−(I1+I2+I3)*Rterm. Because the transition to a low voltage level begins from the decreased high voltage level, the detrimental impact of ISI is mitigated.

Fourth Embodiment

Figure 9:
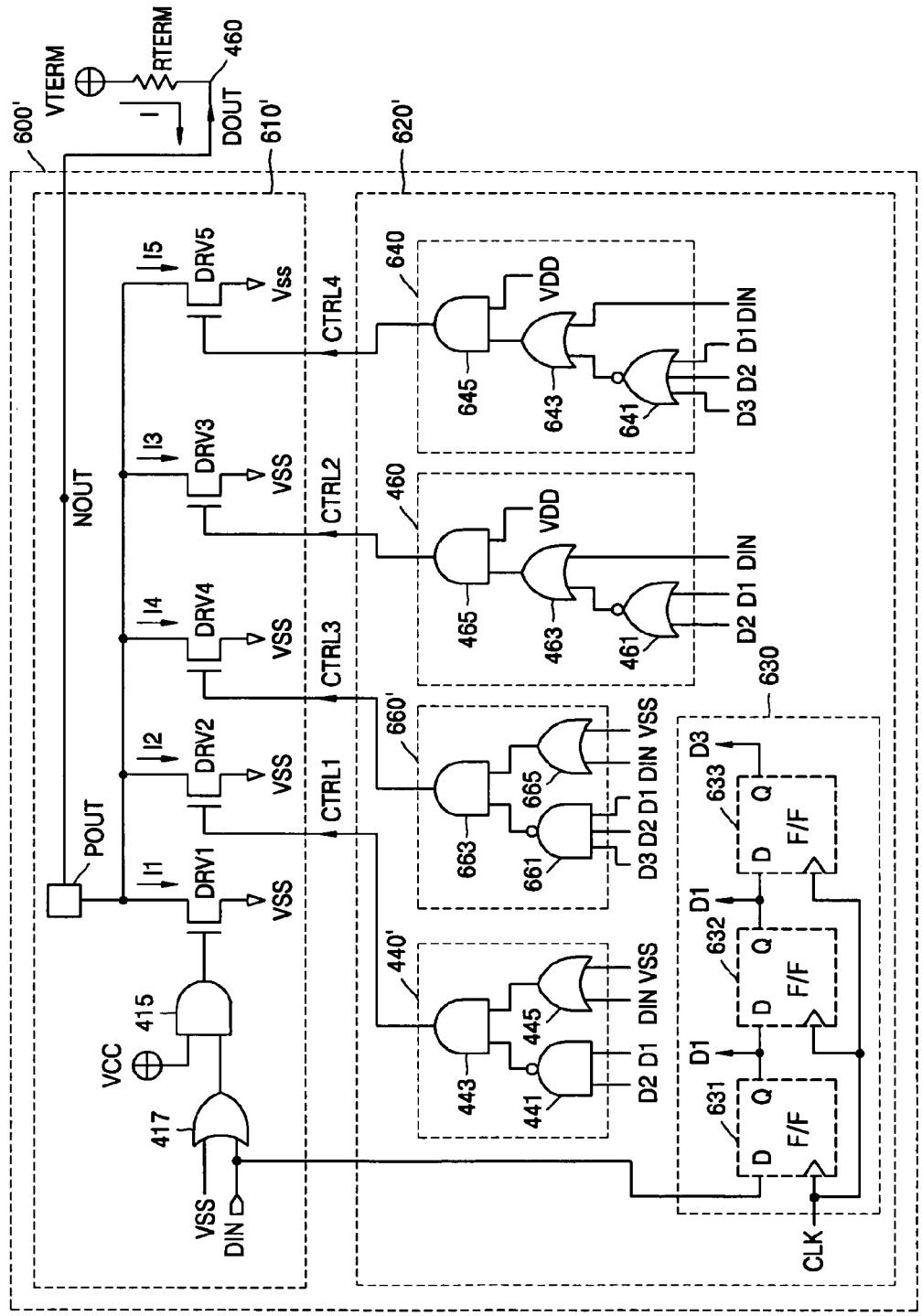
FIG. 9 each illustrates a circuit diagram of a fourth embodiment of an open drain type output buffer according to the present invention.

FIG. 9 illustrates a circuit diagram of another embodiment of an NMOS open drain type output buffer system according to the present invention. In this embodiment, a low voltage level as an input voltage DIN represents a logic "0", a high voltage level as an input voltage DIN represents a logic "1", a low voltage level as an output data DOUT represents a logic "1", and a high voltage level as an output data DOUT represents a logic "0". A low voltage level means a voltage low enough to turn off an NMOS transistor, and a high voltage level means a voltage high enough to turn on an NMOS transistor.

As shown in FIG. 9, the NMOS open drain type output buffer system includes an NMOS open drain type output buffer 600' having an output pad POUT. The output pad POUT is connected via an output node NOUT and a channel 460 to a power supply Vterm (called a termination power) via a termination resistor Rterm. The channel 460 represents, for example, a bus or a portion of a bus, over which a device including the open drain type output buffer 600' and other devices (not shown) communicate.

The NMOS open drain type output buffer 600' includes the output pad POUT, a driver circuit 610', and a control circuit 620'. The output node NOUT is anywhere on the channel 460. The voltage of the output node NOUT is that of the output pad POUT.

The control circuit 620' includes a first determining control circuit 440', a second determining control circuit 460, a third determining control circuit 660', a fourth determining control circuit 640 and a latch circuit 630. The control circuit 620' receives input data DIN per clock edge of a clock CLK and generates a first control signal CTRL1, a second control signal CTRL2, a third control signal CTRL3 and a fourth control signal CTRL4 to partially control operation of the driver circuit 610'.

The latch circuit 630 includes a first latch 631, a second latch 632 and a third latch 633. These latches 631, 632 and 633 are D-type edge-triggered flip-flops and latch their input D per clock edge of the clock CLK. The first latch 631 latches the input data DIN per the clock edge of clock CLK and outputs a first output signal D1. The second latch 632 latches the first output signal D1 per clock edge of the clock CLK and outputs a second output signal D2. The third latch 633 latches the second output signal D2 per clock edge of the clock CLK and outputs a third output signal D3. Accordingly, with respect to a current input data DIN, the first, second and third output signals D1, D2 and D3 represent the three previous input data DIN.

The operation and structure of the first and second determining control circuits 440' and 460 are the same as that described above with respect to FIG. 7. Therefore a description of these circuits will not be repeated for the sake of brevity.

The third determining control circuit 660' includes a NAND gate 661, an OR gate 665 and an AND gate 663. The input signals of the NAND gate 661 are the first, second and third output signals D1, D2 and D3 of the latch circuit 630. The input signals of the OR gate 665 are the input data DIN and a low voltage reference potential (e.g., ground) VSS. As will be appreciated, because the OR gate 665 logic-ORs the input data DIN with a logic low signal, the output of the OR gate 665 will be the input data DIN. The OR gate 665 serves as a delay to promote proper timing in the buffer 600'. The AND gate 663 receives the output of the NAND gate 661 and the input data DIN output from the OR gate 665, and generates the third control signal CTRL3.

The third determining control circuit 660' generates the third control signal CTRL3 of low voltage level when the first, second and third output signals D1, D2 and D3 are logic "1" (high voltage levels in this embodiment), irrespective of the logic value of the input data DIN. When any of the logic values of the first, second and third output signals D1, D2 and D3 is a logic "0" (low voltage level in this embodiment), the voltage level of the third control signal CTRL3 is based on the logic value of the input data DIN. Namely, if the input data DIN has logic value "0", then the third control signal CTRL3 is a low voltage, and if the input data DIN has logic value "1", then the third control signal CTRL3 is a high voltage.

The fourth determining control circuit 640 includes a NOR gate 641, an OR gate 643 and an AND gate 645. The input signals of the NOR gate 641 are the first, second and third output signals D1, D2 and D3 of the latch circuit 630. The OR gate 643 receives the output of the NOR gate 641 and the input data DIN. The AND gate 645 receives the output of the OR gate 643 and a high voltage reference potential (e.g., a power supply voltage) VDD, and generates the fourth control signal CTRL4. As will be appreciated, the AND gate 645 outputs the voltage or logic value output from the OR gate 643. The AND gate 645 serves as a delay to promote proper timing in the buffer 600'.

The fourth determining control circuit 640 generates the fourth control signal CTRL4 of high voltage level when the first, second and third output signals D1, D2 and D3 are logic "0" (low voltage levels in this embodiment), irrespective of the current logic value of the input data DIN. When any of the logic values of the first, second and third output signals D1, D2 and D3 is a logic "1" (high voltage level in this embodiment), the voltage level of the fourth control signal CTRIA is based on the logic value of the input data DIN. Namely, if the input data DIN has logic value "0", then the fourth control signal CTRL4 is a low voltage, and if the input data DIN has logic value "1", then the fourth control signal CTRIA is a high voltage.

The driver circuit 610' includes the first driver DRV1, the second driver DRV2, the third driver DRV3, a fourth driver DRV4 and a fifth driver DR5. The drivers DRV1–DRV5 are connected between the output node NOUT and the ground power VSS in parallel. The drivers DRV1–DRV5 control the voltage level of the output node NOUT according to the input data DIN and the first-fourth control signals CTRL1–CTRL4.

The first driver DRV1 is an NMOS transistor having a first gate width size. The source and drain of the NMOS transistor are coupled to the ground power VSS and the output node NOUT, respectively. The gate of the NMOS transistor for the first driver DRV1 is coupled to the input data DIN via the AND gate 415 and the OR gate 417. The OR gate 417 ORs the input data DIN with a low voltage reference potential (e.g., ground) VSS. As such the OR gate 417 outputs the input data DIN. The AND gate 415 ANDs the input data DIN output from the OR gate 417 with a high voltage reference potential (e.g., a power supply voltage) VCC. Accordingly, when the device including the open drain type output buffer is off, the first driver DRV1 is off. More particularly, however, the OR gate 417 and the AND gate 415 serves as a delay so that the input data DIN reaching the gate of the first driver DRV1 is offset from the first-fourth control signals CTRL1–CTRL4 reaching the second-fifth drivers DRV2–DRV5, respectively.

When the logic value of the input data DIN is "1", the first driver DRV1 drives a first pull-down current I1 from the output node NOUT to the ground power VSS. The level of the output voltage DOUT generated by this pull down operation is Vterm−I1*Rterm.

The second-fifth drivers DRV2–DRV5 are NMOS transistors having second-fifth gate width sizes, respectively. The second-fifth gate width sizes are less than the first gate width size. The source, drain and gate of the NMOS transistor for the second driver DRV2 are coupled to the ground power VSS, the output node NOUT and the output of the first determining control circuit 440', respectively. The source, drain and gate of the NMOS transistor for the third driver DRV3 are coupled to the ground power VSS, the output node NOUT and the output of the second determining control circuit 460, respectively. The source, drain and gate of the NMOS transistor for the fourth driver DRV4 are coupled to the ground power VSS, the output node NOUT and the output of the third determining control circuit 660', respectively. The source, drain and gate of the NMOS transistor for the fifth driver DRV5 are coupled to the ground power VSS, the output node NOUT and the output of the fourth determining control circuit 640, respectively.

As stated previously with respect to the embodiment of FIG. 7, when the logic value of the first control signal CTRL1 is "1", the second driver DRV2 drives a second pull-down current I2 from the output node NOUT to the ground power VSS. The level of the output voltage DOUT generated by this pull down operation is Vterm−I2*Rterm. Similarly, when the logic value of the second, third or fourth control signals CTRL2, CTRL3 or CTRL 4 is "1", the third, fourth or fifth drivers DRV3, DRV4 or DRV5, respectively, drive a third, fourth or fifth pull-down current I3, I4 or I5 from the output node NOUT to the ground power VSS. The level of the output voltage DOUT generated by each of these pull down operations is Vterm−I3*Rterm, Vterm−I4*Rterm, and Vterm−I5*Rterm.

Figure 1B:
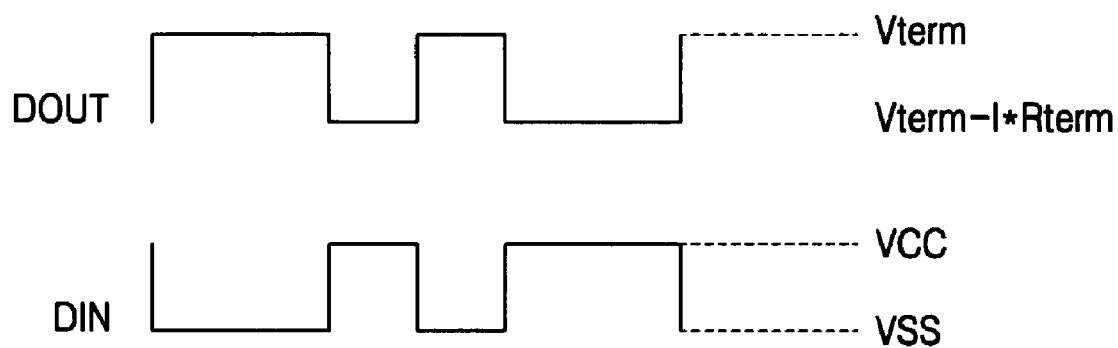
FIG. 1(b) shows the voltage level of the input data DIN in relation to the output data DOUT for the NMOS open drain type output buffer system of FIG. 1(a)
Figure 2A:
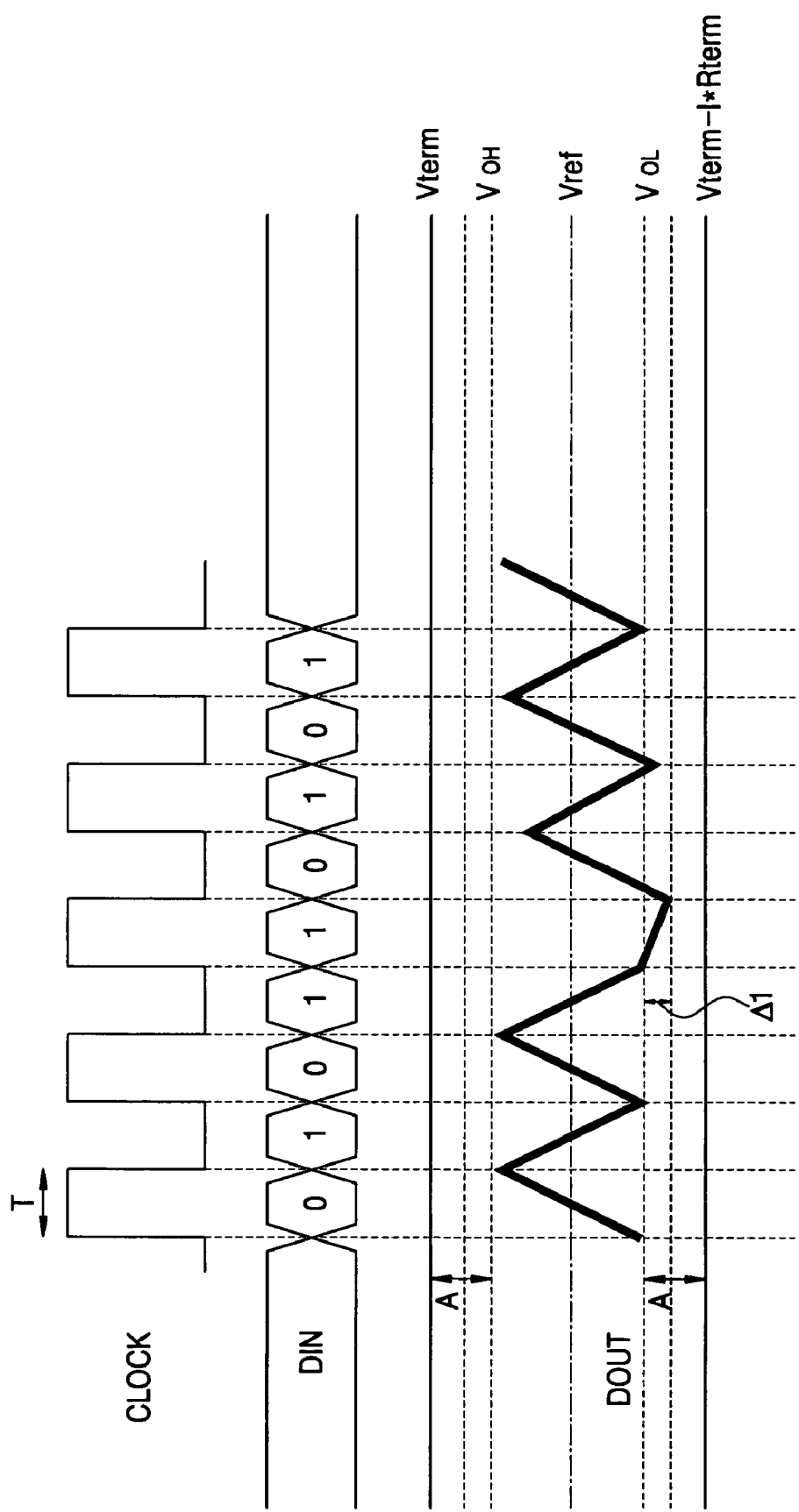
FIGS. 2(a), 2(b), 3(a) and 3(b) illustrate examples of the voltage variation in the output data DOUT caused by Intersymbol Interference for the NMOS open drain type output buffer system in FIG. 1(a)
Figure 2B:
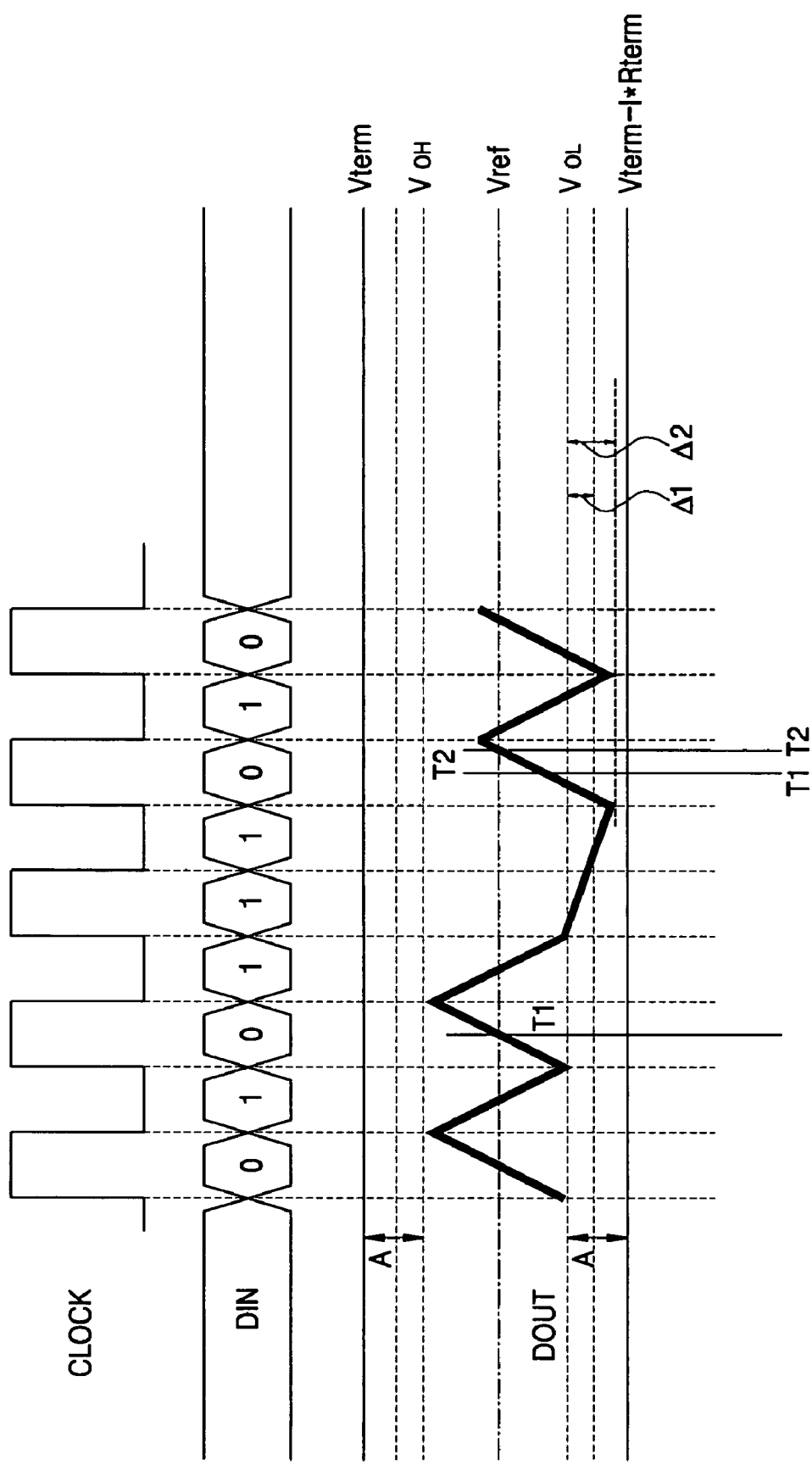
Figure 3A:
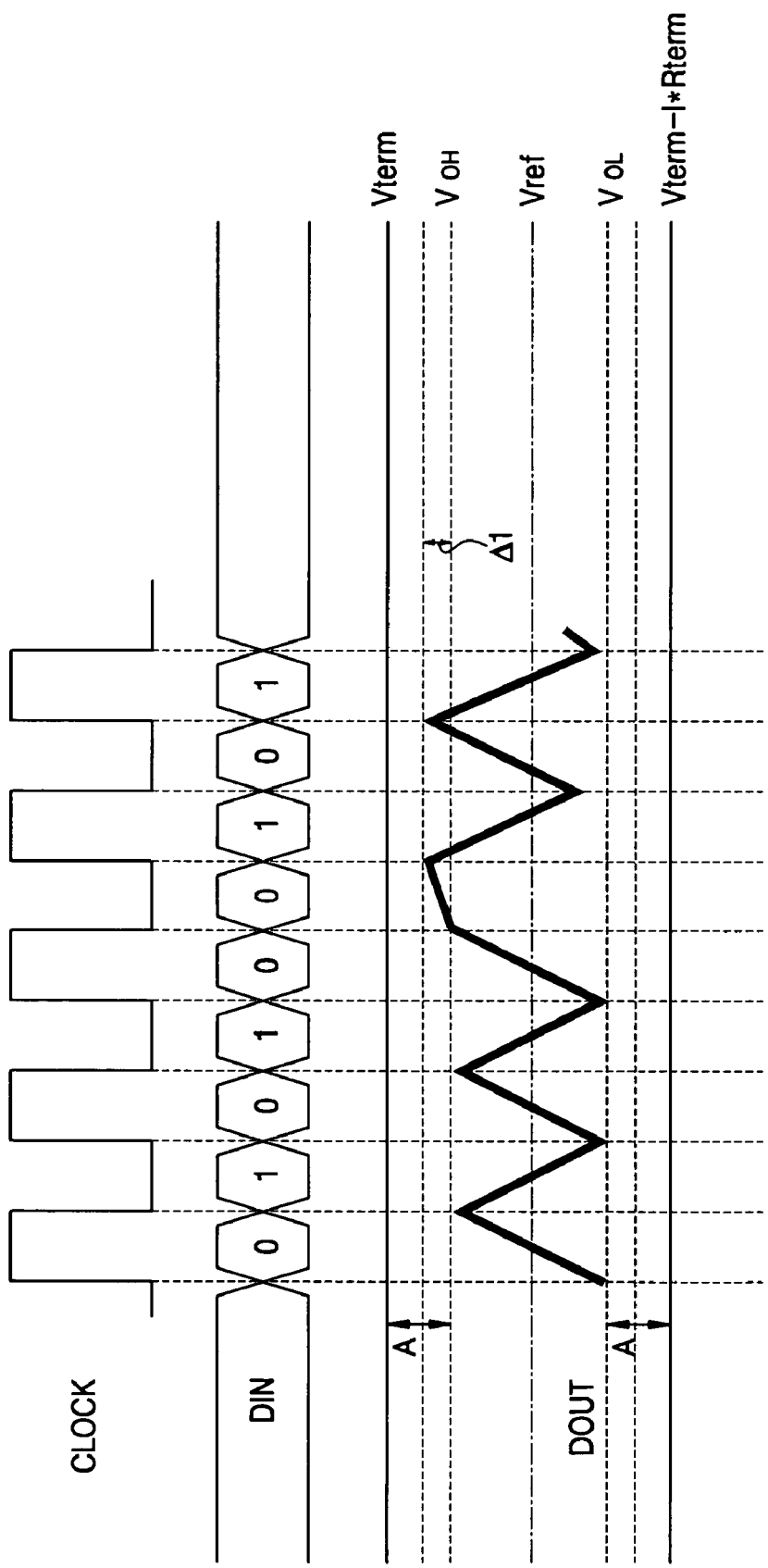
Figure 3B:
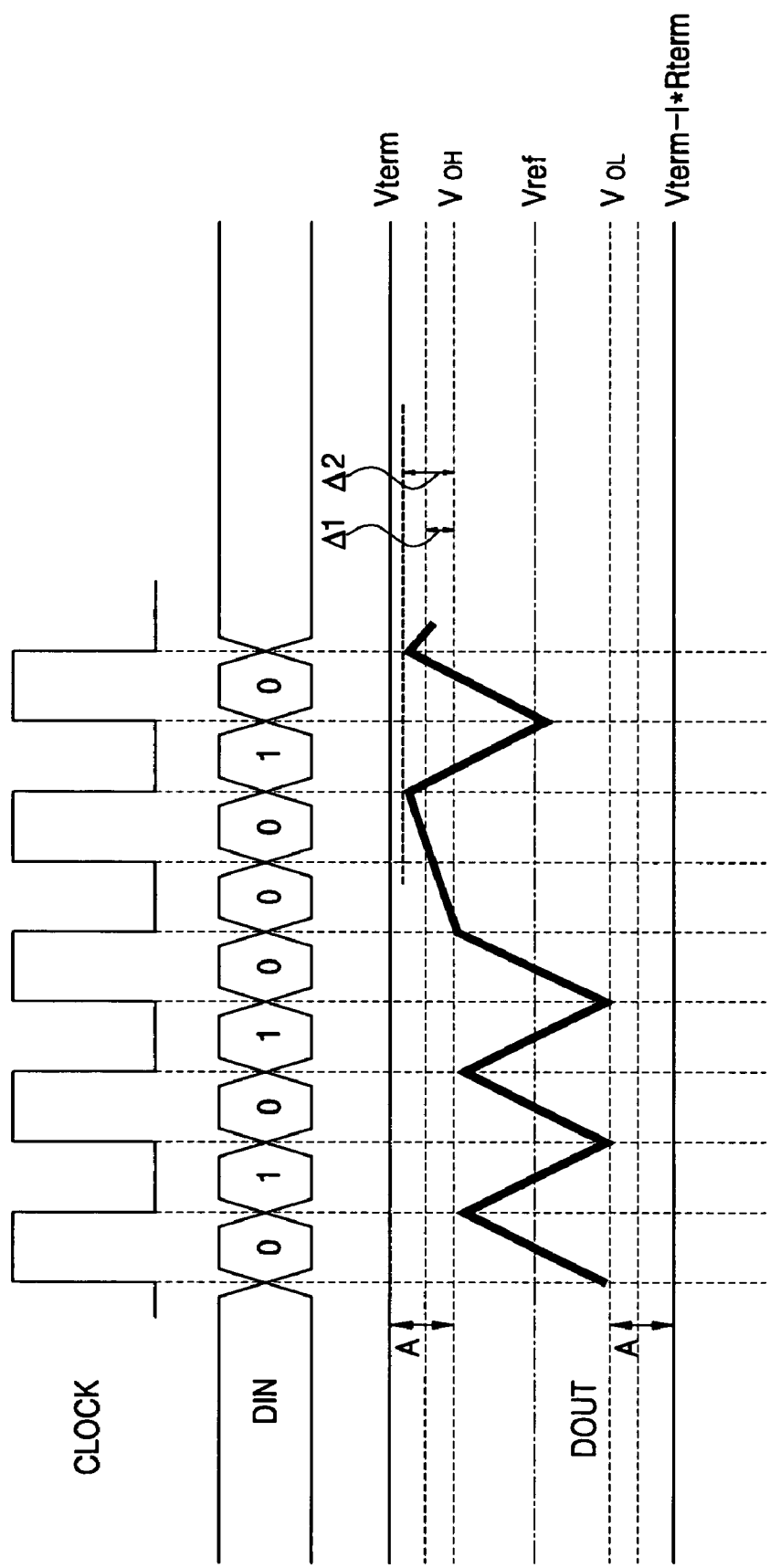

Accordingly, when the first-fifth drivers DRV1–DRV5 are turned on, the level of the output voltage DOUT becomes VOL=Vterm−(I1+I2+I3+I4+I5)*Rterm. In one exemplary embodiment of the present invention, the first-fifth gate width sizes are established such that the data output DOUT voltage achieved when the first-fifth drivers DRV1–DRV5 are turned on is substantially equal to the low voltage VOL of the output data in the prior art open drain type output buffer of FIG. 1(*a*). As will be appreciated from the description in this application, the gate width sizes chosen for the first-fifth drivers DRV1–DRV5 are design parameters established based on the application of the open drain type output buffer.

As described above with respect to FIG. 7, an exemplary second driver DRV2, in transitioning from a turned-on to a turned-off state compensates for additional attenuation caused by ISI when two successive low voltage output data DOUT are generated. Likewise, an exemplary embodiment of the fourth driver DRV4, in transitioning from a turned-on state to a turned-off state compensates for the further additional attenuation caused by ISI when three successive low voltage output data DOUT are generated.

Also as described above with respect to FIG. 7, an exemplary third driver DRV3, in transitioning from a turned-on to a turned-off state compensates for additional attenuation caused by ISI when two successive high voltage output data DOUT are generated. Likewise, an exemplary embodiment of the fifth driver DRV5, in transitioning from a turned-on state to a turned-off state compensates for the further additional attenuation caused by ISI when three successive high voltage output data DOUT are generated.

Exemplary operation of the open drain output buffer according to the present invention will be readily understood from the previous discussion of the embodiment of FIG. 7 with respect to FIG. 8. Namely, the second and third drivers DRV2 and DRV3 are controlled by the first and second determining control circuits 440' and 460 in the same manner as discussed above with respect to the embodiment of FIG. 7. The fourth driver DRV4 is controlled by the third determining control circuit 660' in the same manner that the first determining control circuit 440' controls the second driver DRV2, except that the control is based upon the output data DOUT having been at a low voltage level for three successive output data (i.e., three successive "1"s in the input data DIN). Similarly, the fifth driver DRV5 is controlled by the fourth determining control circuit 640 in the same manner that the second determining control circuit 460 controls the third driver DRV3, except that the control is based on the output data DOUT having been at a high voltage level for three successive output data (i.e., three successive "0"s in the input data DIN).

Fifth Embodiment

Figure 10:
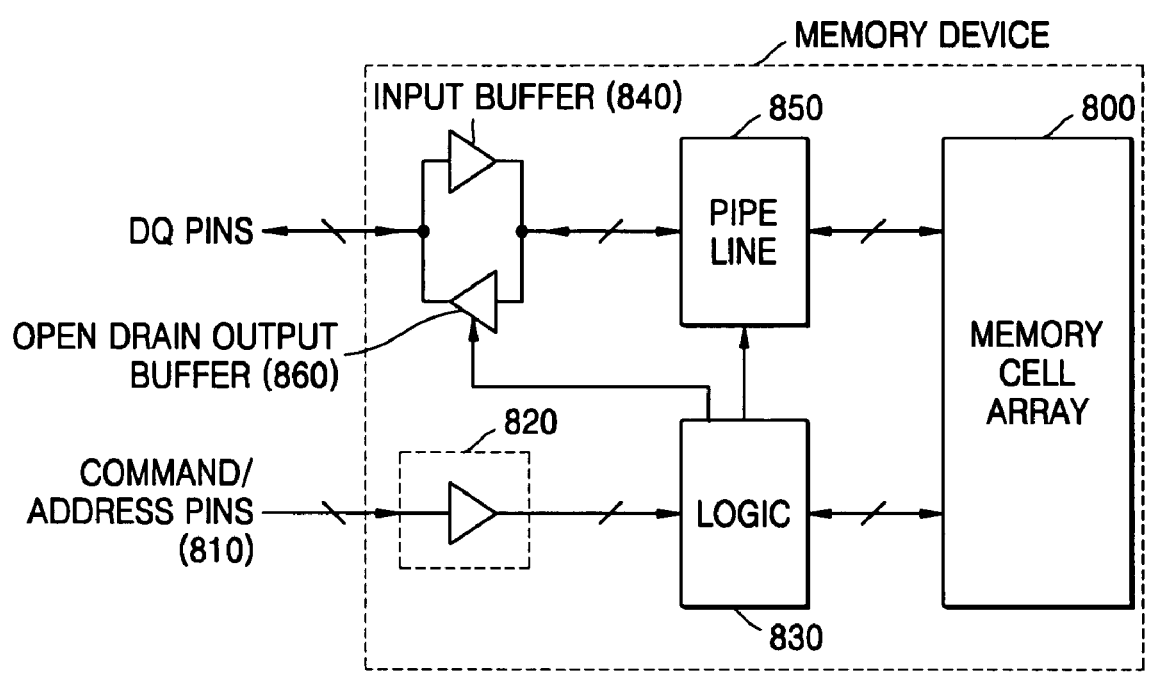
FIG. 10 illustrates a memory device incorporating the open drain output buffer according to any of the embodiment of the present invention.

FIG. 10 illustrates a memory device incorporating the open drain output buffer according to any of the embodiments of the present invention. As shown, the memory device includes a memory cell array 800 for storing data and outputting stored data. Data is stored and read out based on command and address information received at command/address pins 810 of the memory device. This information is buffered by a command/address buffer 820 and decoded by a logic circuit 830 before being applied to the memory cell array 800.

As shown in FIG. 10, the data being input to or output from the memory cell array 800 is input at or output from data pins DQ of the memory device. Data being input or stored is buffered in an input buffer 840, then pipelined by a pipeline circuit 850. Data being output is pipelined by the pipeline circuit 850 and buffered by an output buffer 860. The output buffer may be an open drain type output buffer according to the present invention. The memory device of FIG. 10 will be recognized as a well-known memory device except for the output buffer 860. As such, a detailed description of the components and operation thereof will be omitted for the sake of brevity.

Furthermore, while a memory device was provided as an example of a device to which the output buffer of the present invention may be applied, it will be readily apparent that the present invention is not limited to this application.

The invention being thus described, it will be obvious that the same may be varied in many ways. For example, PMOS embodiments of the present invention will be readily understood from the forgoing disclosure. Such variations are not to be regarded as a departure from the spirit and scope of the invention, and all such modifications as would be obvious to one skilled in the art are intended to be included within the scope of the present invention.

I claim:

1. An open-drain type output buffer, comprising:
   a first driver selectively pulling an output node towards a low voltage based on input data;
   at least one secondary driver having first and second states, each secondary driver pulling the output node towards the low voltage when in the first state, and each secondary driver not pulling the output node towards the low voltage in the second state;
   a control circuit determining when at least two consecutive high voltage output data at the output node have been generated, and controlling the secondary driver such that the secondary driver is in the first state when the control circuit determines at least two consecutive high voltage output data have been generated; and wherein
   the control circuit controls the secondary driver such that the secondary driver is in the first state before a next data in the input data when the control circuit determines at least two consecutive high voltage output data have been generated.

2. The buffer of claim 1, wherein
   the at least one secondary driver includes first and second secondary drivers; and
   the control circuit includes,
      a first determining control circuit determining when two consecutive high voltage output data have been generated, and controlling the first secondary driver such that the first secondary driver is in the first state when the first determining control circuit determines two consecutive high voltage output data have been generated, and
      a second determining control circuit determining when three consecutive high voltage output data have been generated, and controlling the second secondary driver such that the second secondary driver is in the first state when the second determining control circuit determines three consecutive high voltage output data have been generated.

3. The buffer of claim 2, wherein
   the first determining control circuit determines when two consecutive high voltage output data have been generated based on two previous input data, and controls the first secondary driver based on the determination and the current input data; and
   the second determining control circuit determines when three consecutive high voltage output data have been generated based on three previous input data, and controls the second secondary driver based on the determination and the current input data.

4. The buffer of claim 2, wherein the control circuit further comprises:
   a latch circuit storing three previous input data.

5. The buffer of claim 2, further comprising:
at least first and second tertiary drivers, each first and second tertiary driver having first and second states, each first and second tertiary driver pulling the output node towards the low voltage when in a first state, and each first and second tertiary driver not pulling the output node towards the low voltage in a second state; and
the control circuit includes,
   a third determining control circuit determining when two consecutive low voltage output data have been generated, and controlling the first tertiary driver such that the first tertiary driver is in the second state when the third determining control circuit determines two consecutive low voltage output data have been generated, and
   a fourth determining control circuit determining when three consecutive low voltage output data have been generated, and controlling the second tertiary driver such that the second tertiary driver is in the second state when the fourth determining control circuit determines three consecutive low voltage output data have been generated.

6. The buffer of claim 1, wherein the control circuit performs the determining and controlling operations based on a current input data and at least two previous input data.

7. The buffer of claim 6, wherein the control circuit comprises:
a latch circuit storing the two previous input data.

8. The buffer of claim 1, wherein the control circuit controls the state of the secondary driver based on the current input data when the control circuit does not determine that at least two consecutive high voltage output data have been generated.

9. The buffer of claim 1, further comprising:
at least one tertiary driver having first and second states, each tertiary driver pulling the output node towards the low voltage when in a first state, and each tertiary driver not pulling the output node towards the low voltage in a second state; and wherein
the control circuit determines when at least two consecutive low voltage output data at the output node have been generated, and controlling the tertiary driver such that the tertiary driver is in the second state when the control circuit determines at least two consecutive low voltage output data have been generated.

10. An open-drain type output buffer, comprising:
a driver circuit having at least a first and second driver, each of the first and second driver for pulling an output node to a low voltage; and
a control circuit determining when at least two consecutive high voltage output data at the output node have occurred, and controlling the driver circuit to maintain the first driver off such that the first driver does not pull the output node to the low voltage and to turn the second driver on such that the second driver pulls the output node to the low voltage when the control circuit determines that at least two consecutive high voltage output data have occurred.

11. An open-drain type output buffer, comprising:
a driver circuit having at least two drivers for pulling an output node to a low voltage; and
a control circuit determining if at least two consecutive high voltage output data have occurred at the output node, and controlling the driver circuit such that a high voltage output data at the output node decreases by a predetermined voltage before the output data transitions from the high voltage output data to a low voltage output data.

12. A memory device, comprising:
a memory cell array for storing data; and
an output buffer configured to buffer data output from the memory cell array, the output buffer including,
   a driver circuit having at least two drivers for pulling an output node to a low voltage, and
   a control circuit at least one of (1) determining if at least two consecutive high voltage output data have occurred at the output node and controlling the driver circuit such that a high voltage output data at the output node decreases by a predetermined voltage before the output data transitions from the high voltage output data to a low voltage output data; (2) determining if at least two consecutive low voltage output data have occurred at the output node and controlling the driver circuit such that a low voltage output data at the output node increases by a predetermined voltage before the output data transitions from the low voltage output data to a high voltage output data; and (3) determining when a transition from a steady high voltage output data to a low voltage output occurs at the output node and controlling the driver circuit such that a voltage level of the output node decreases more rapidly than if the output data transitioned from a high voltage output data to a low voltage output data.

13. A memory device, comprising:
a memory cell array for storing data; and
an output buffer configured to buffer data output from the memory cell array, the output buffer including,
   a driver circuit having at least two drivers for pulling an output node to a low voltage, and
   a first control circuit determining if at least two consecutive high voltage output data have occurred at the output node and controlling the driver circuit such that a high voltage output data at the output node decreases by a predetermined voltage before the output data transitions from the high voltage output data to a low voltage output data;
   a second control circuit determining if at least two consecutive low voltage output data have occurred at the output node and controlling the driver circuit such that a low voltage output data at the output node increases by a predetermined voltage before the output data transitions from the low voltage output data to a high voltage output data.

14. A memory device, comprising:
a memory cell array for storing data; and
an output buffer configured to buffer data output from the memory cell array, the output buffer including,
   a driver circuit having at least two drivers for pulling an output node to a low voltage, and
   a first control circuit determining if at least two consecutive low voltage output data have occurred at the output node and controlling the driver circuit such that a low voltage output data at the output node increases by a predetermined voltage before the output data transitions from the low voltage output data to a high voltage output data; and
   a second control circuit determining when a transition from a steady high voltage output data to a low voltage output occurs at the output node and controlling the driver circuit such that a voltage level of the output node decreases more rapidly than if the output data transitioned from a high voltage output data to a low voltage output data.

* * * * *